(12) United States Patent
Pyo

(10) Patent No.: US 10,976,778 B2
(45) Date of Patent: Apr. 13, 2021

(54) DISPLAY DEVICE

(71) Applicant: LG ELECTRONICS INC., Seoul (KR)

(72) Inventor: Jonggil Pyo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/775,895

(22) Filed: Jan. 29, 2020

(65) Prior Publication Data

US 2020/0241599 A1 Jul. 30, 2020

(30) Foreign Application Priority Data

Jan. 29, 2019 (KR) .................. 10-2019-0011015

(51) Int. Cl.
| | | |
|---|---|---|
| *G06F 1/16* | (2006.01) | |
| *H05K 5/00* | (2006.01) | |
| *H05K 5/02* | (2006.01) | |

(52) U.S. Cl.
CPC ......... *G06F 1/1652* (2013.01); *H05K 5/0017* (2013.01); *H05K 5/0217* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,655,267 | B2* | 5/2017 | Cope ...................... | G09F 9/35 |
| 9,743,542 | B2* | 8/2017 | Heo ...................... | G06F 1/1652 |
| 9,844,152 | B2* | 12/2017 | Heo ...................... | H05K 5/0017 |
| 9,924,603 | B2* | 3/2018 | Cope ...................... | H05K 5/0217 |
| 10,098,246 | B1* | 10/2018 | Cope ...................... | H04N 5/64 |
| 10,111,344 | B2* | 10/2018 | Han ...................... | H05K 7/1427 |
| 10,201,103 | B2* | 2/2019 | Kim ...................... | H05K 5/0217 |
| 10,314,183 | B2* | 6/2019 | Heo ...................... | H05K 1/028 |
| 10,362,690 | B2* | 7/2019 | Han ...................... | G02F 1/1333 |
| 10,390,443 | B2* | 8/2019 | Kim ...................... | H05K 5/0017 |
| 10,410,549 | B1* | 9/2019 | Kim ...................... | G09F 11/02 |
| 10,506,726 | B2* | 12/2019 | Kang ...................... | H05K 5/0017 |

(Continued)

FOREIGN PATENT DOCUMENTS

| | | |
|---|---|---|
| EP | 3115988 | 1/2017 |
| EP | 3173897 | 5/2017 |
| EP | 3419073 | 12/2018 |

OTHER PUBLICATIONS

European Patent Office Application Serial No. 20154083.8, Search Report dated Jun. 24, 2020, 7 pages.

*Primary Examiner* — Lisa Lea-Edmonds
(74) *Attorney, Agent, or Firm* — Lee, Hong, Degerman, Kang & Waimey

(57) ABSTRACT

A display device is disclosed. The display device includes a housing, a roller installed inside the housing, a display unit rolled or unrolled around the roller, a first foldable link and a second foldable link opposite to each other, the first foldable link and the second foldable link each including one end pivotally coupled to the housing and another end pivotally coupled to an upper part of the display unit, a first motor and a second motor installed inside the housing and respectively pivoting the first foldable link and the second foldable link, and a controller configured to control the first motor and the second motor so that the first foldable link and the second foldable link are synchronized.

15 Claims, 34 Drawing Sheets

(56) References Cited

U.S. PATENT DOCUMENTS

| | | | |
|---|---|---|---|
| 10,531,582 B2* | 1/2020 | Park | H05K 5/0017 |
| 10,534,402 B1* | 1/2020 | Kim | G09F 9/301 |
| 10,564,676 B2* | 2/2020 | Kwon | G06F 1/1652 |
| 10,586,475 B2* | 3/2020 | Park | G06F 1/1652 |
| 10,588,223 B2* | 3/2020 | Han | H05K 1/028 |
| 10,642,315 B2* | 5/2020 | Kim | G09F 9/301 |
| 10,687,428 B2* | 6/2020 | Kim | H05K 5/0217 |
| 10,694,627 B2* | 6/2020 | Park | H05K 5/0017 |
| 2002/0070910 A1 | 6/2002 | Fujieda et al. | |
| 2017/0103735 A1* | 4/2017 | Oh | G09G 5/006 |
| 2018/0301124 A1* | 10/2018 | Oh | G09G 5/14 |
| 2019/0197960 A1* | 6/2019 | Kim | G05D 3/10 |
| 2019/0198783 A1* | 6/2019 | Kim | B65H 75/4402 |
| 2019/0246512 A1* | 8/2019 | Heo | G09F 9/301 |
| 2019/0324501 A1* | 10/2019 | Kim | G09F 9/301 |
| 2019/0371214 A1* | 12/2019 | Kim | G06F 1/1652 |
| 2020/0004296 A1* | 1/2020 | Lee | G06F 1/1652 |
| 2020/0008308 A1* | 1/2020 | Shin | G09F 9/301 |
| 2020/0008309 A1* | 1/2020 | Kim | H01L 51/5253 |
| 2020/0013317 A1* | 1/2020 | Cho | G09F 9/301 |
| 2020/0035133 A1* | 1/2020 | Pyo | G09F 9/301 |
| 2020/0058272 A1* | 2/2020 | Oh | G06F 1/1601 |
| 2020/0068728 A1* | 2/2020 | Kang | H05K 5/0247 |
| 2020/0077194 A1* | 3/2020 | Kim | H04R 7/04 |
| 2020/0084897 A1* | 3/2020 | Shin | G09F 9/301 |
| 2020/0093011 A1* | 3/2020 | Lee | H05K 5/0017 |
| 2020/0103741 A1* | 4/2020 | Song | G03B 21/60 |
| 2020/0107458 A1* | 4/2020 | Park | H05K 7/20963 |
| 2020/0137902 A1* | 4/2020 | Park | G09F 9/301 |
| 2020/0160760 A1* | 5/2020 | Park | H04R 1/2896 |
| 2020/0168131 A1* | 5/2020 | Park | G06F 1/1652 |
| 2020/0201394 A1* | 6/2020 | Choi | G06F 1/1652 |

* cited by examiner (a)

(b)

DISPLAY DEVICE

Pursuant to 35 U.S.C. § 119(a), this application claims the benefit of earlier filing date and right of priority to Korean Patent Application No. 10-2019-0011015, filed on Jan. 29, 2019, the contents of which are hereby incorporated by reference herein in its entirety.

BACKGROUND OF THE INVENTION

Field of the Invention

The present disclosure relates to a display device.

Discussion of the Related Art

With the development of the information society, various demands for display devices are increasing. Various display devices, such as liquid crystal displays (LCDs), plasma display panels (PDPs), electroluminescent displays (ELDs), and vacuum fluorescent displays (VFDs), have been recently studied and used in response to various demands for the display devices.

Among the various display devices, a display device using an organic light emitting diode (OLED) has advantages of better luminance characteristics and better viewing angle characteristics than the liquid crystal display and can be implemented as an ultra-thin profile display device because it does not require a backlight unit.

A flexible display may be bendable or rolled on a roller. There may be implemented a display device that is unrolled from or rolled on the roller using the flexible display, if necessary. In this instance, it is a problem to stably roll or unroll the flexible display around the roller.

SUMMARY OF THE INVENTION

An object of the present disclosure is to address the above-described and other problems.

Another object of the present disclosure is to provide a display device capable of controlling operations of a left foldable link and a right foldable link that unroll a display unit from a roller.

Another object of the present disclosure is to provide a display device capable of controlling operations of a left motor and a right motor driving a display unit.

Another object of the present disclosure is to provide a display device capable of obtaining a torque required to raise a foldable link using a plurality of gears.

Another object of the present disclosure is to provide a display device including a gas spring providing a force required to raise a foldable link.

To achieve the above-described and other objects, in one aspect of the present disclosure, there is provided a display device comprising a housing; a roller installed inside the housing; a display unit rolled or unrolled around the roller; a first foldable link and a second foldable link opposite to each other, the first foldable link and the second foldable link each including one end pivotally coupled to the housing and another end pivotally coupled to an upper part of the display unit; a first motor and a second motor installed inside the housing and respectively pivoting the first foldable link and the second foldable link; and a controller configured to control the first motor and the second motor so that the first foldable link and the second foldable link are synchronized.

According to another aspect of the present disclosure, the display device may further comprise a gas spring including a cylinder pivotally coupled to the housing, and a piston reciprocating between the inside and the outside of the cylinder and pivotally coupled to the first foldable link.

According to another aspect of the present disclosure, the first foldable link may include a lower link including one side pivotally coupled to the housing, and an upper link pivotally coupled to the upper part of the display unit. The first foldable link may further include a shock absorber that is disposed inside the housing and is in contact with the lower link as the first foldable link is folded.

According to another aspect of the present disclosure, the first motor may include a first drive shaft and a first rotary encoder sensing an angular displacement of the first drive shaft. The controller may obtain information about the angular displacement of the first drive shaft from the first rotary encoder and control the first motor.

According to another aspect of the present disclosure, the display device may further comprise a first gear rotating by the first motor, a first protrusion formed on the first gear and spaced apart from an axis of rotation of the first gear, and a second rotary encoder including a board facing the first gear and a position sensing unit formed on the board and protruding toward the first gear. The position sensing unit may sense the first protrusion as the first gear rotates. The controller may obtain information about an angular displacement of the first gear from the position sensing unit and control the first motor.

According to another aspect of the present disclosure, the position sensing unit may be provided in plural, and the plurality of position sensing units may be arranged along a rotational moving line of the first protrusion.

According to another aspect of the present disclosure, the first foldable link may include a lower link including one side pivotally coupled to the housing, and an upper link pivotally coupled to the upper part of the display unit. The first foldable link may further include a second protrusion formed on the lower link and spaced apart from an axis of pivot of the lower link, and a position sensor installed inside the housing, adjacent to a pivot moving line of the second protrusion, and sensing the second protrusion. The controller may obtain information about an angular displacement of the lower link from the position sensor and control the first motor.

According to another aspect of the present disclosure, the first motor may be a step motor, and the controller may control a step of the first motor.

According to another aspect of the present disclosure, the display device may further comprise a brake installed on the drive shaft of the first motor. The controller may actuate the brake and control the first motor.

According to another aspect of the present disclosure, the first foldable link may include a lower link including one side pivotally coupled to the housing, and an upper link pivotally coupled to the upper part of the display unit. The first foldable link may further include a first gear fixed to the drive shaft of the first motor, and a second gear fixed to the lower link and engaged with the first gear, wherein an axis of rotation of the second gear is aligned with an axis of pivot of the lower link.

According to another aspect of the present disclosure, the display device may further comprise a third gear coupled to the drive shaft of the first motor, a first double gear including a primary gear engaged with the third gear and a secondary gear with a lager diameter than the primary gear, and a second double gear including a third gear engaged with the secondary gear and a fourth gear with a smaller diameter than the third gear and engaged with the second gear.

According to another aspect of the present disclosure, the first foldable link may include a lower link including one side pivotally coupled to the housing, and an upper link pivotally coupled to the upper part of the display unit. The gas spring may provide a force for raising the lower link to the lower link.

According to another aspect of the present disclosure, as the first foldable link is unfolded, a distance between one side and another side of the gas spring may increase.

According to another aspect of the present disclosure, the display device may further comprise a fourth gear formed at an upper end of the first lower link, and a fifth gear formed at a lower end of the first upper link and engaged with the fourth gear.

According to another aspect of the present disclosure, as the first lower link and the second lower link are raised, a distance between the first joint and the second joint may increase.

Effects of a display device according to the present disclosure are described as follows.

According to at least one aspect of the present disclosure, the present disclosure can unroll a display unit from a roller while maintaining left-right symmetry of the display unit rolled on the roller using a lead screw.

According to at least one aspect of the present disclosure, the present disclosure can control operations of a left foldable link and a right foldable link that unroll a display unit from a roller.

According to at least one aspect of the present disclosure, the present disclosure can control operations of a left motor and a right motor driving a display unit.

According to at least one aspect of the present disclosure, the present disclosure can obtain a torque required to raise a foldable link using a plurality of gears.

According to at least one aspect of the present disclosure, the present disclosure can provide a display device including a gas spring providing a force required to raise a foldable link.

Further scope of applicability of the present disclosure will become apparent from the detailed description given blow. However, it should be understood that the detailed description and specific examples, while indicating preferred embodiments of the disclosure, are given by illustration only, since various changes and modifications within the spirit and scope of the disclosure will become apparent to those skilled in the art from this detailed description.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
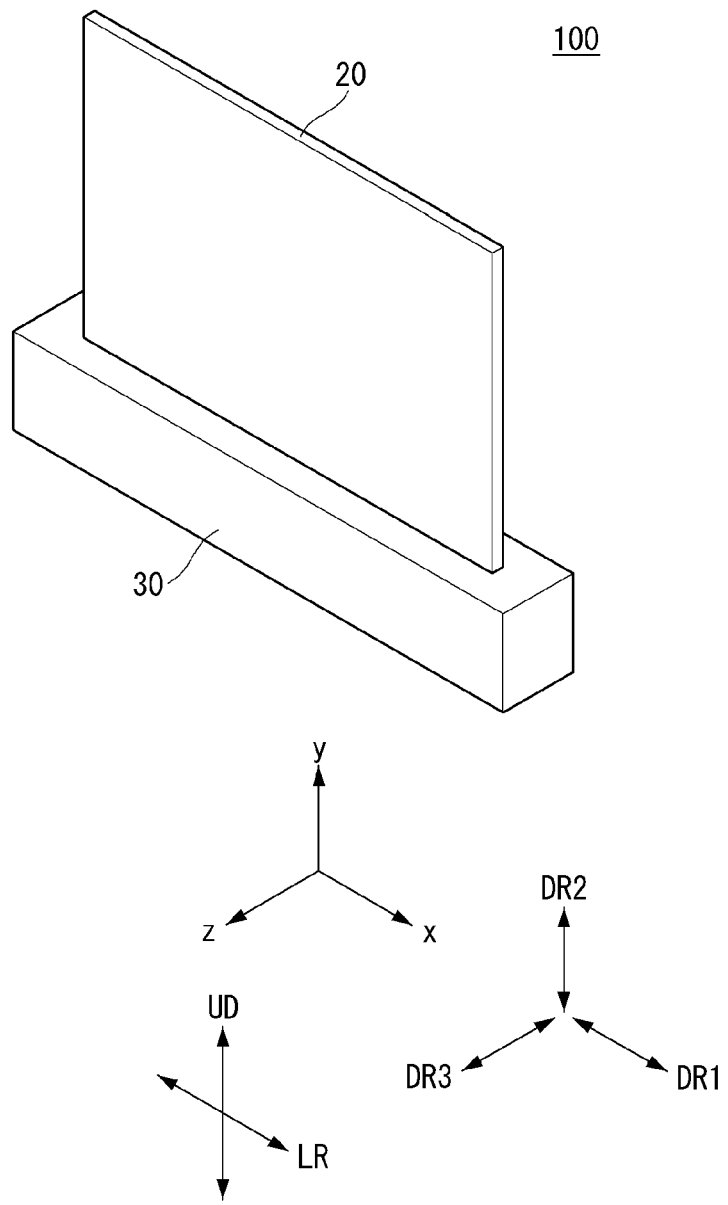
FIGS. 1 to 36 are figures according to embodiments of the present disclosure.

Reference will now be made in detail embodiments of the disclosure examples of which are illustrated in the accompanying drawings. Since the present disclosure may be modified in various ways and may have various forms, specific embodiments are illustrated in the drawings and are described in detail in the present specification. However, it should be understood that the present disclosure are not limited to specific disclosed embodiments, but include all modifications, equivalents and substitutes included within the spirit and technical scope of the present disclosure.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following embodiments of the present disclosure are provided to those skilled in the art in order to describe the present disclosure more completely. Accordingly, shapes and sizes of elements shown in the drawings may be exaggerated for clarity.

In the following description, an organic light emitting diode (OLED) display panel will be given as an example of a display panel, but a display panel applicable to the present disclosure is not limited thereto.

Referring to FIG. 1, a display device 100 may include a display unit 20 and a housing 30. The housing 30 may form an internal space. At least a portion of the display unit 20 may be positioned inside the housing 30. At least a portion of the display unit 20 may be positioned outside the housing 30. The display unit 20 may display an image on a front surface.

A direction parallel to a longitudinal direction of the housing 30 may be referred to as a first direction DR1. The first direction DR1 may be parallel to +x-axis direction or −x-axis direction. The +x-axis direction may be referred to as a right direction. The −x-axis direction may be referred to as a left direction. A direction in which the display unit 20 displays an image may be referred to as +z-axis direction, a forward direction, or a front direction. An opposite direction of the direction in which the display unit 20 displays the image may be referred to as −z-axis direction, a rearward direction, or a rear direction. A third direction DR3 may be parallel to the +z-axis direction or the −z-axis direction. A direction parallel to a height direction of the display device 100 may be referred to as a second direction DR2. The second direction DR2 may be parallel to +y-axis direction or −y-axis direction. The +y-axis direction may be referred to as an upward direction. The −y-axis direction may be referred to as a downward direction. The third direction DR3 may be a direction perpendicular to the first direction DR1 and/or the second direction DR2.

The first direction DR1 and the second direction DR2 may be commonly referred to as a horizontal direction. The third direction DR3 may be referred to as a vertical direction.

A left-to-right direction LR may be parallel to the first direction DR1, and an up-down direction UD may be parallel to the second direction DR2.

Figure 2:
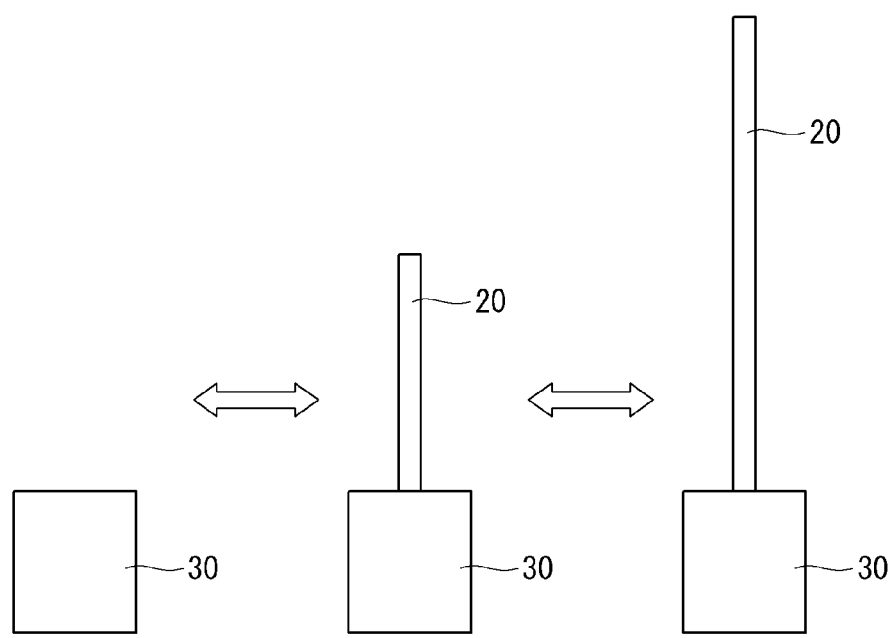

Referring to FIG. 2, the display unit 20 may be entirely positioned inside the housing 30. At least a portion of the display unit 20 may be positioned outside the housing 30. A degree in which the display unit 20 is exposed to the outside of the housing 30 may be adjusted, if necessary.

Figure 3:
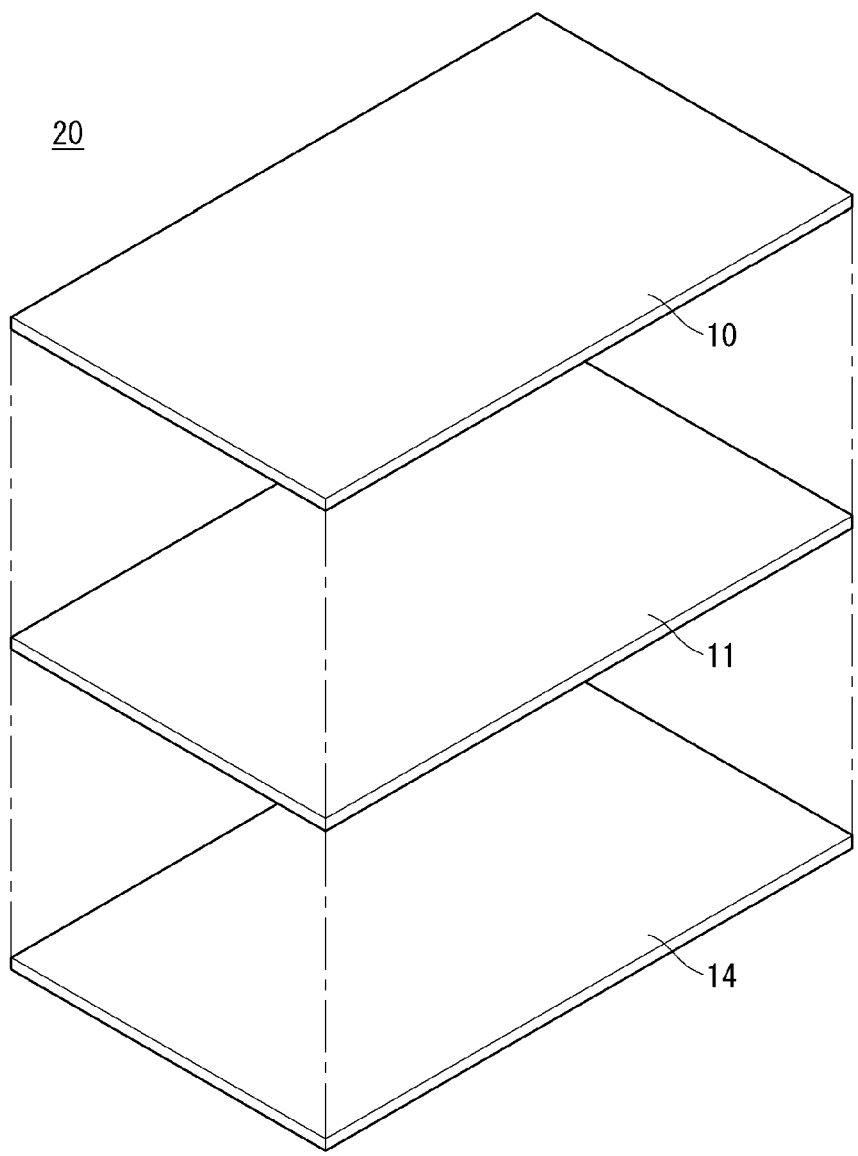

Referring to FIG. 3, a display panel 10 may be flexible. For example, the display panel 10 may be an organic light emitting diode (OLED) display panel. In the following description, embodiments of the disclosure are described using the OLED display panel as an example of the display panel 10, but are not limited thereto. For example, a liquid crystal display (LCD) panel, a plasma display panel (PDP), and a field emission display (FED) panel may be used.

The display panel 10 may have a front surface displaying an image. The display panel 10 may have a rear surface opposite the front surface. The front surface of the display panel 10 may be covered with a light transmission material. For example, the light transmission material may include glass, resin, or plastic.

A plate 11 may be coupled to a rear surface of the display panel 10. The plate 11 may be coupled, fastened, or attached to the rear surface of the display panel 10. The plate 11 may include a metal material. The plate 11 may be referred to as a module cover, a cover, a display panel cover, or a panel cover.

A resin layer 14 may be coupled to a rear surface of the plate 11. The resin layer 14 may cover the plate 11. The resin layer 14 may cause the plate 11 not to be exposed to the outside.

Figure 4:
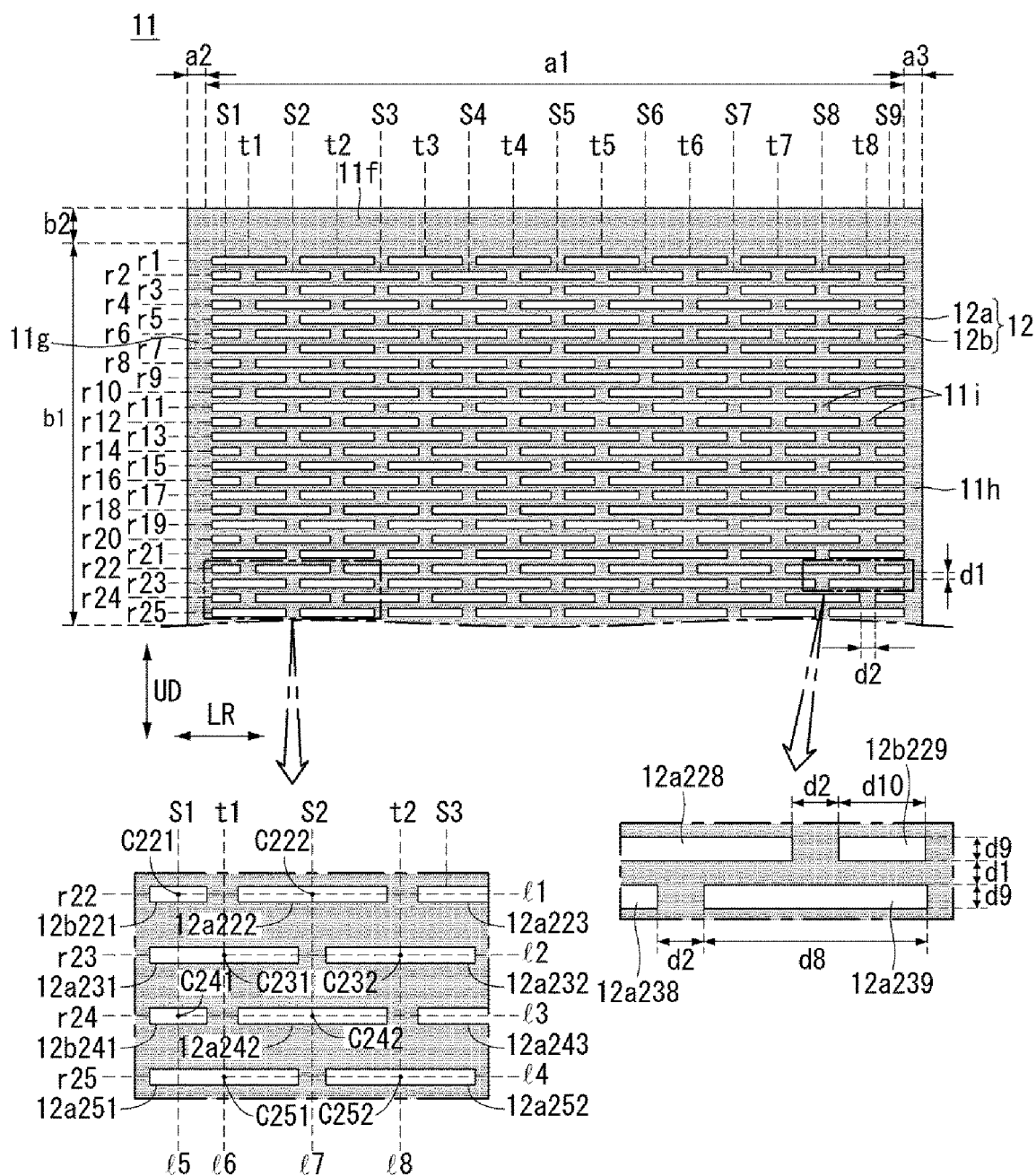

Referring to FIG. 4, the plate 11 may include a plurality of holes 12. The plate 11 may include an area (hereinafter referred to as "hole formation area") where the holes 12 are formed and areas 11f, 11g and 11h where the hole 12 is not formed. The areas 11f, 11g and 11h where the hole 12 is not formed may surround the area where the holes 12 are formed. The areas 11f, 11g and 11h can protect edges of the display panel 10. The hole 12 may be referred to as an opening.

The first area 11g where the hole 12 is not formed, the hole formation area, and the second area 11h where the hole 12 is not formed may be sequentially disposed along the left-to-right direction LR of the plate 11. A width of the first area 11g in the left-to-right direction LR may be "a2". A width of the hole formation area in the left-to-right direction LR may be "a1". A width of the second area 11h in the left-to-right direction LR may be "a3".

The third area 11f where the hole 12 is not formed and the hole formation area may be sequentially disposed along the up-down direction UD of the plate 11. A height of the third area 11f in the up-down direction UD may be "b2". A height of the hole formation area in the up-down direction UD may be "b1".

The third area 11f may be coupled to a structure. For example, the structure may be an upper bar. The upper bar may be coupled to a link.

The holes 12 may penetrate the plate 11. The holes 12 may be formed by perforating the plate 11. The holes 12 may be slits 12a and 12b. The slits 12a and 12b may have a shape extended along the left-to-right direction LR of the plate 11. The holes 12 may include a relatively long slit 12a and a relatively short slit 12b.

The relatively long slit 12a may have a width d8 and a width d9. The relatively short slit 12b may have a width d10 and a width d9.

The slits 12a and 12b may be spaced apart from each other along the left-to-right direction LR of the plate 11. The adjacent slits 12a and 12b may be positioned at a predetermined distance d2.

The slits 12a and 12b may be spaced apart from each other along the up-down direction UD of the plate 11. The adjacent slits 12a and 12b may be positioned at a predetermined distance d1.

As the distances d1 and d2 between the slits 12a and 12b decrease, the plate 11 may be easily rolled or unrolled. As the distances d1 and d2 between the slits 12a and 12b increase, elasticity of the plate 11 may increase.

The display panel 10 may have a very thin thickness. The display panel 10 may be easily wrinkled due to the thin thickness. In addition, the display panel 10 may be easily damaged by an external impact due to the thin thickness.

The plate 11 is fixed to the display panel 10 and can increase rigidity of the display panel 10. The plate 11 supports the display panel 10 and can prevent the display panel 10 from being wrinkled.

The plate 11 may include a metal material with high rigidity. The plate 11 may be formed of a material with a high elastic strength. The plate 11 may be rolled on or unrolled from a roller 143 by the slits 12a and 12b included in the plate 11. Further, even if the plate 11 is rolled on or unrolled from the roller 143, the plate 11 may not be permanently deformed by the slits 12a and 12b included in the plate 11.

An adhesive layer 13 may be formed on the rear surface of the display panel 10. The adhesive layer 13 can fix the display panel 10 to the plate 11. The display panel 10, the adhesive layer 13, and the plate 11 may be integrally coupled to form the display unit 20 and may be rolled on or unrolled from the roller 143.

The slits 12a and 12b may be arranged in rows and columns. Odd-numbered rows r1, r3, r5, r7, r9, r11, r13, r15, r17, r19, r21, r23 and r25 may be formed by the relatively long slits 12a. The relatively long slits 12a of the odd-numbered rows r1, r3, r5, r7, r9, r11, r13, r15, r17, r19, r21, r23 and r25 may form columns t1, t2, t3, t4, t5, t6, t7 and t8.

Even-numbered rows r2, r4, r6, r8, r10, r12, r14, r16, r18, r20, r22 and r24 may be formed by the relatively short slits 12b and the relatively long slits 12a. The slits 12a and 12b of the even-numbered rows r2, r4, r6, r8, r10, r12, r14, r16, r18, r20, r22 and r24 may form columns s1, s2, s3, s4, s5, s6, s7, s8 and s9.

The relatively short slits 12b and the relatively long slits 12a may be alternatively disposed along the up-down direction UD. The relatively short slits 12b may be disposed on both sides of the even-numbered rows r2, r4, r6, r8, r10, r12, r14, r16, r18, r20, r22 and r24 in the left-to-right direction LR.

A straight line 11 connecting a center C221 of a first slit 12b221 of the 22th row r22 and a center C222 of a second slit 12a222 of the 22th row r22 may pass through centers of remaining slits of the 22th row r22.

A straight line 12 connecting a center C231 of a first slit 12a231 of the 23th row r23 and a center C232 of a second slit 12a232 of the 23th row r23 may pass through centers of remaining slits of the 23th row r23.

A straight line 13 connecting a center C241 of a first slit 12b241 of the 24th row r24 and a center C242 of a second slit 12a242 of the 24th row r24 may pass through centers of remaining slits of the 24th row r24.

A straight line 14 connecting a center C251 of a first slit 12a251 of the 25th row r25 and a center C252 of a second slit 12a252 of the 25th row r25 may pass through centers of remaining slits of the 25th row r25.

A straight line 15 connecting the center C221 of the 11th slit 12b221 of the first column s1 of the even-numbered rows r2, r4, r6, r8, r10, r12, r14, r16, r18, r20, r22 and r24 and the center C241 of the 12th slit 12b241 of the first column s1 may pass through centers of remaining slits of the first column s1.

A straight line 16 connecting the center C231 of the 12th slit 12a231 of the first column t1 of the odd-numbered rows r1, r3, r5, r7, r9, r11, r13, r15, r17, r19, r21, r23 and r25 and the center C251 of the 13th slit 12a251 of the first column t1 may pass through centers of remaining slits of the first column t1.

A straight line 17 connecting the center C222 of the 11th slit 12a222 of the second column s2 of the even-numbered rows r2, r4, r6, r8, r10, r12, r14, r16, r18, r20, r22 and r24 and the center C242 of the 12th slit 12a242 of the second column s2 may pass through centers of remaining slits of the second column s2.

A straight line 18 connecting the center C232 of the 12th slit 12a232 of the second column t2 of the odd-numbered rows r1, r3, r5, r7, r9, r11, r13, r15, r17, r19, r21, r23 and r25 and the center C252 of the 13th slit 12a252 of the second column t2 may pass through centers of remaining slits of the second column t2.

Figure 5:
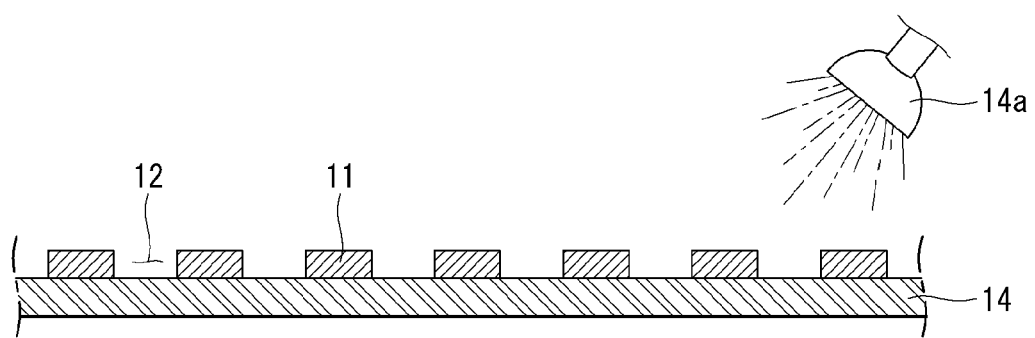
Figure 6:
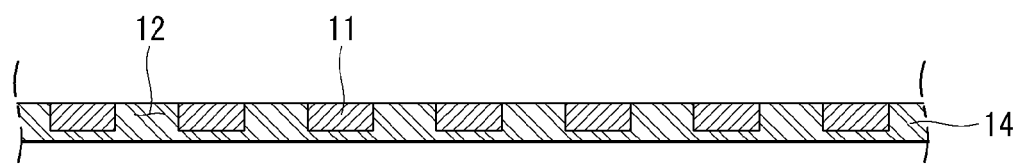

Referring to FIGS. 5 and 6, the resin layer 14 and the plate 11 may be coupled to each other through a lamination process. The plate 11 may be placed on the resin layer 14. The plate 11 and the resin layer 14 may be heated by a heating device 14a. A portion of the resin layer 14 may be melted. The melted portion of the resin layer 14 may be attached to the plate 11. The melted portion of the resin layer 14 may be filled in the holes 12 of the plate 11. The plate 11 may be accommodated in the resin layer 14.

When the heated plate 11 and the heated resin layer 14 are cooled, the plate 11 and the resin layer 14 may be formed as one body. A front surface of a coupling body of the plate 11 and the resin layer 14 may be flat.

Figure 7:
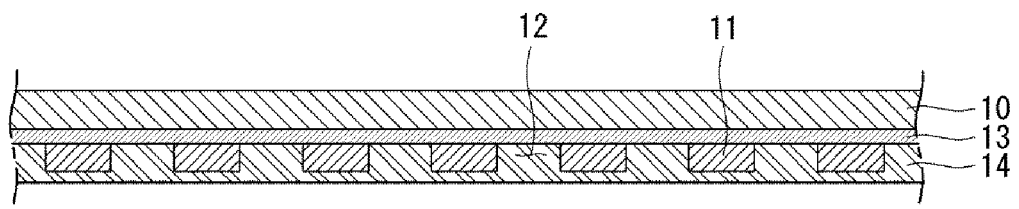
Figure 8:
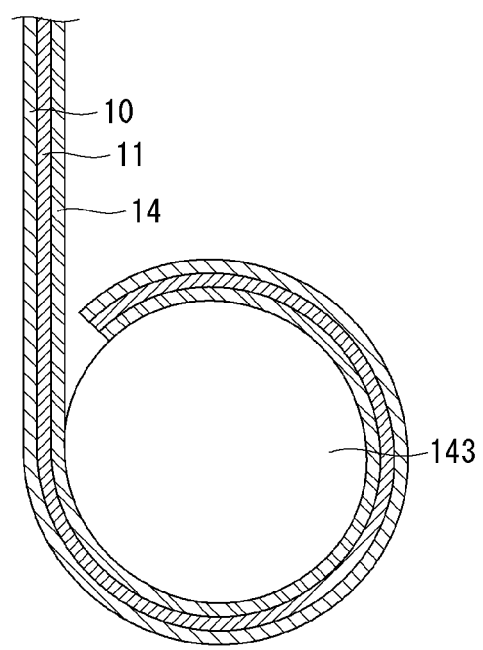

Referring to FIGS. 7 and 8, the adhesive layer 13 may be formed on the rear surface of the display panel 10. The adhesive layer 13 can fix the display panel 10 to the plate 11. Because the front surface of the coupling body of the plate 11 and the resin layer 14 is flat, the adhesive layer 13 can fix the display panel 10 to the resin layer 14.

The resin layer 14 may be formed of a material with high flexibility. For example, the resin layer 14 may be formed of urethane or rubber.

The display panel 10, the adhesive layer 13, the plate 11, and the resin layer 14 may be integrally coupled to form the display unit 20 and may be rolled on or unrolled from the roller 143.

Figure 9:
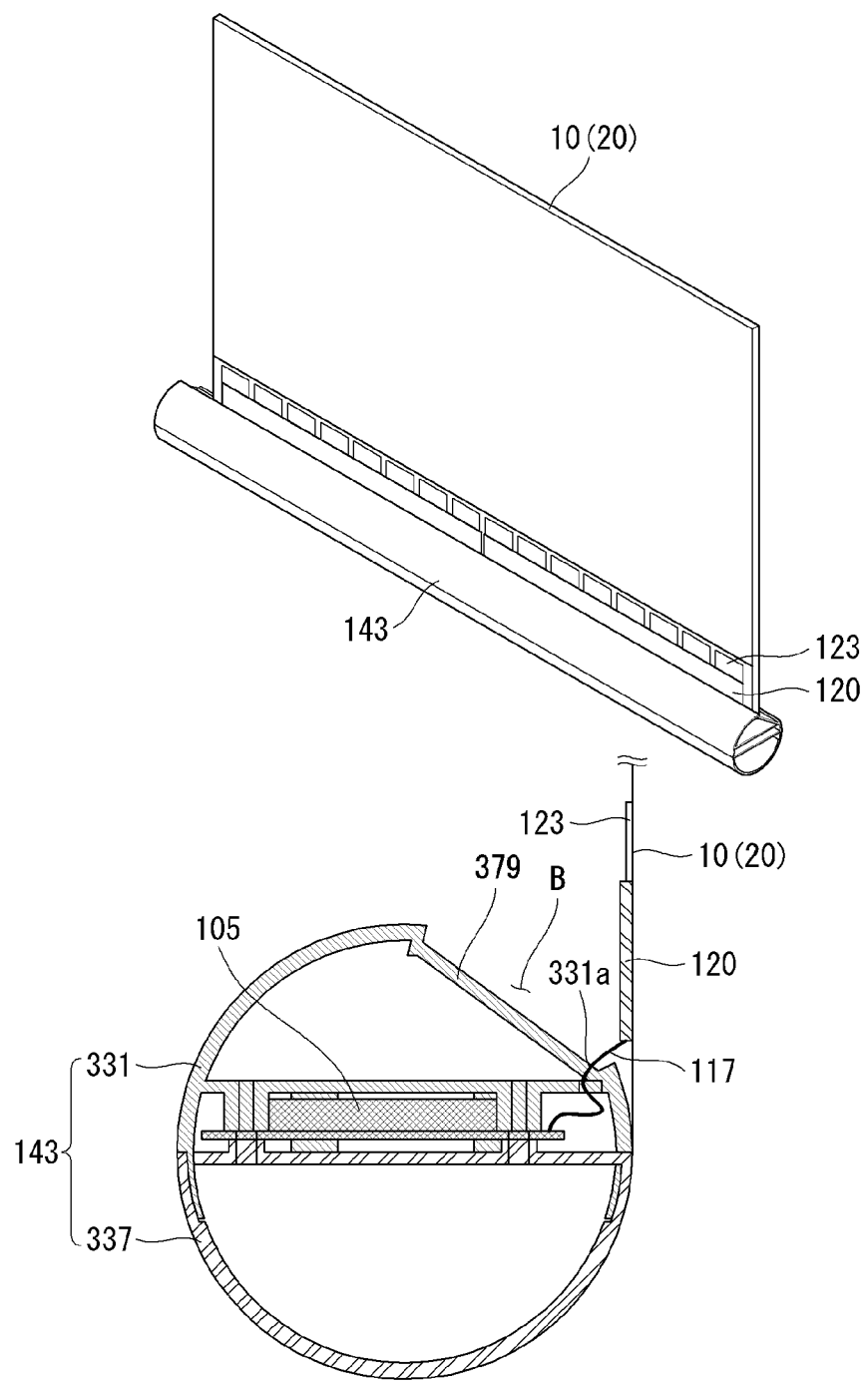

Referring to FIG. 9, a lower end of the display panel 10 may be coupled to the roller 143. The display panel 10 may be rolled on or unrolled from the roller 143.

The front surface of the display panel 10 may be coupled to a plurality of source printed circuit boards (PCBs) 120. The plurality of source PCBs 120 may be spaced apart from each other.

A source chip-on film (COF) 123 may connect the display panel 10 to the source PCBs 120. The source COF 123 may be positioned on the front surface of the display panel 10.

The roller 143 may include a first part 331 and a second part 337. The first part 331 and the second part 337 may be fastened by a screw. A timing controller board 105 may be mounted inside the roller 143.

The source PCBs 120 may be electrically connected to the timing controller board 105. The timing controller board 105 can transmit digital video data and timing control signals to the source PCBs 120.

Cables 117 may electrically connect the source PCBs 120 to the timing controller board 105. For example, the cable 117 may be a flexible flat cable (FFC). The cable 117 may pass through a hole 331a. The hole 331a may be formed in a seating part 379 or the first part 331. The cable 117 may be positioned between the display panel 10 and the second part 337.

The seating part 379 may be formed on an outer periphery of the first part 331. The seating part 379 may be formed by stepping a portion of the outer periphery of the first part 331. The seating part 379 may form a space B. When the display unit 20 is rolled on the roller 143, the source PCBs 120 may be accommodated in the seating part 379. As the source PCBs 120 are accommodated in the seating part 379 as described above, the source PCBs 120 are not bent, and durability of the source PCBs 120 can be improved.

The cables 117 can electrically connect the timing controller board 105 to the source PCBs 120.

Figure 10:
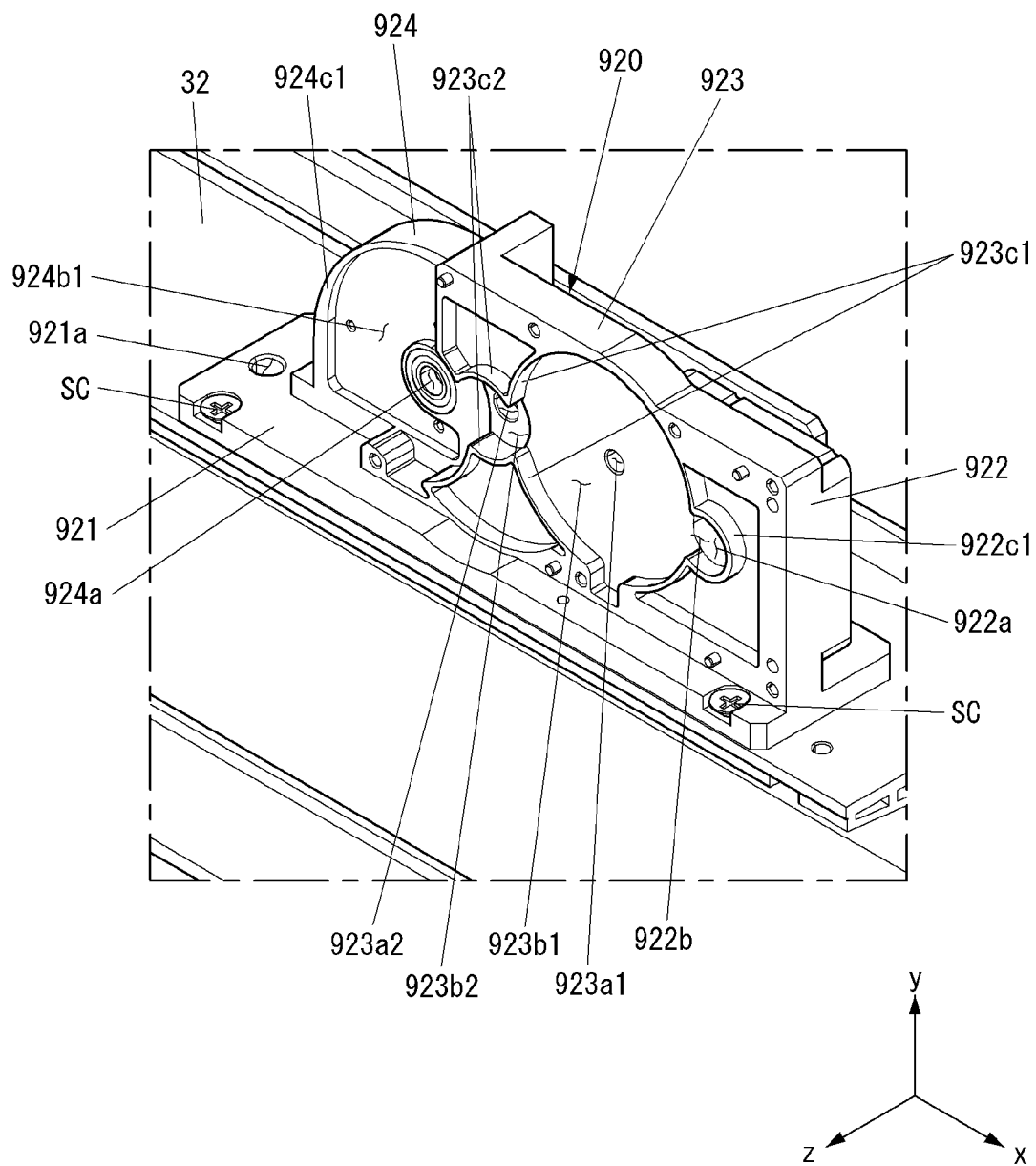

Referring to FIG. 10, a base 32 may have a plate shape. The base 32 may extend in the +x-axis direction.

A fastening portion 921 may be disposed on an upper surface of the base 32. The fastening portion 921 may be referred to as a coupling portion 921. The fastening portion 921 may have a plate shape. The fastening portion 921 may be fixed to the upper surface of the base 32. The fastening portion 921 may be fastened to the base 32 by fastening members SC.

A link mount 924 may be formed on an upper surface of the fastening portion 921. The link mount 924 may be integrally formed with the fastening portion 921. The link mount 924 may include a hole 924a. The hole 924a may penetrate the link mount 924 in the +z-axis direction. The link mount 924 may include a wall 924c1 protruding in the +z-axis direction. The wall 924c1 may form an accommodation space 924b1. The wall 924c1 may be formed along the circumference of the hole 924a.

A gear mount 923 may be formed on the upper surface of the fastening portion 921. The gear mount 923 may be integrally formed with the fastening portion 921. The gear mount 923 may be positioned on the right side of the link mount 924. The gear mount 923 may be integrally formed with the link mount 924. The gear mount 923 may include holes 923a1 and 923a2. The holes 923a1 and 923a2 may penetrate the gear mount 923 in the +z-axis direction. The first hole 923a1 may be positioned on the right side of the second hole 923*a*2. The gear mount 923 may include walls 923*c*1 and 923*c*2 protruding in the +z-axis direction. The first wall 923*c*1 may form a first accommodation space 923*b*1. The first wall 923*c*1 may be formed around the circumference of the first hole 923*a*1. The second wall 923*c*2 may form a second accommodation space 923*b*2. The second wall 923*c*2 may be formed around the circumference of the second hole 923*a*2. The first accommodation space 923*b*1 may be positioned on the right side of the second accommodation space 923*b*2.

A motor mount 922 may be formed on the upper surface of the fastening portion 921. The motor mount 922 may be integrally formed with the fastening portion 921. The motor mount 922 may be positioned on the right side of the gear mount 923. The motor mount 922 may be integrally formed with the gear mount 923. The motor mount 922 may include a hole 922*a*. The hole 922*a* may penetrate the motor mount 922 in the +z-axis direction. The motor mount 922 may include a wall 922*c*1 protruding in the +z-axis direction. The wall 922*c*1 may form an accommodation space 922*b*. The wall 922*c*1 may be formed around the circumference of the hole 922*a*.

The walls 922*c*1, 923*c*1, 923*c*2, and 924*c*1 may be coupled to each other. The accommodation spaces 922*b*, 923*b*1, 923*b*2, and 924*b*1 may communicate with each other. A hole 921*a* may be formed on the upper surface of the fastening portion 921. The hole 921*a* may penetrate the fastening portion 921 in the y-axis direction. The hole 921*a* may be positioned on the left side of the link mount 924. The hole 921*a*, the link mount 924, the gear mount 923, and the motor mount 922 may be sequentially arranged along the x-axis direction.

Figure 11:
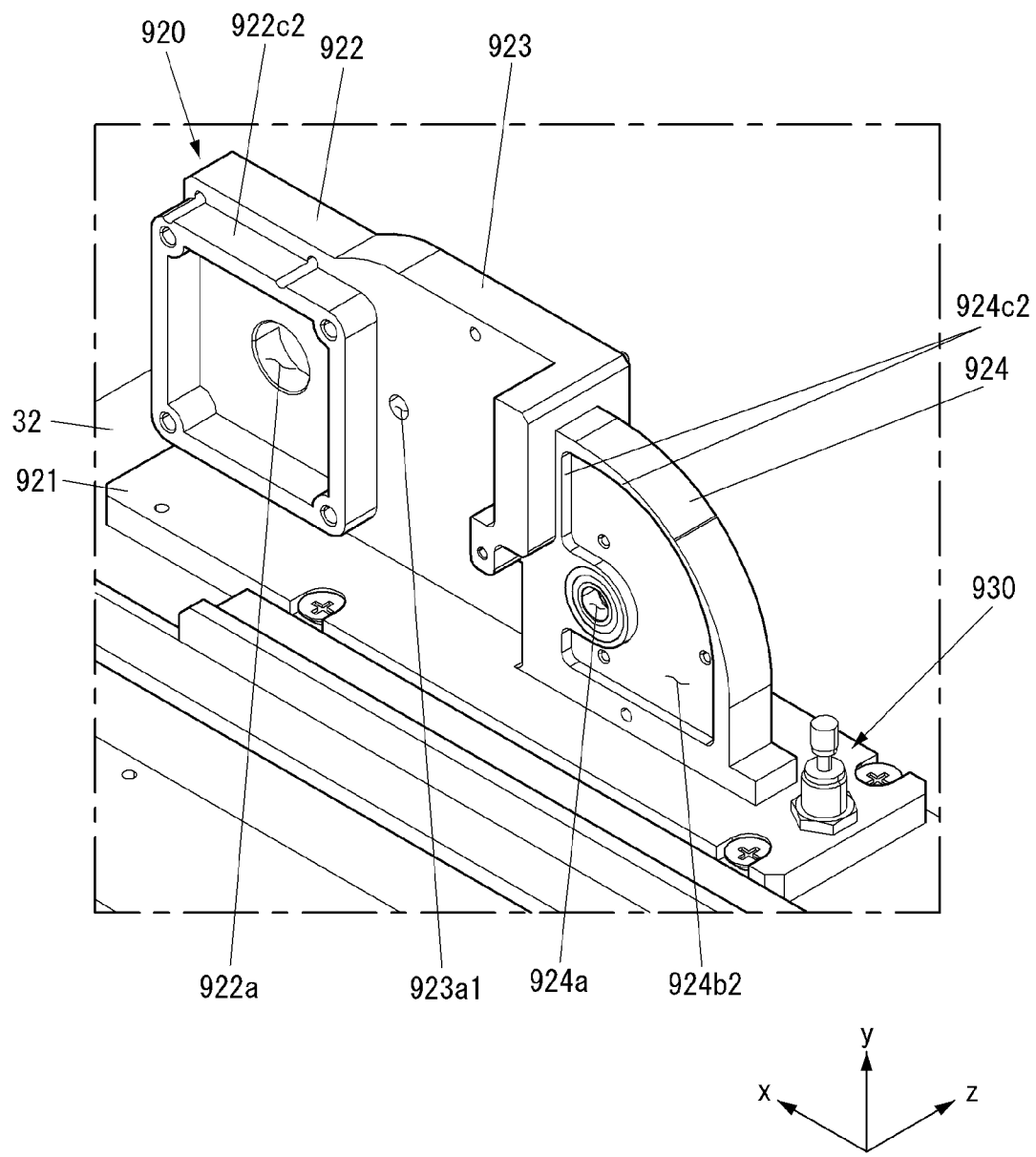

Referring to FIG. 11, the motor mount 922 may include a wall 922*c*2 protruding in the −z-axis direction. The wall 922*c*2 may be formed around the circumference of the hole 922*a*.

The link mount 924 may include a wall 924*c*2 protruding in the −z-axis direction. The wall 924*c*2 may form an accommodation space 924*b*2. The wall 924*c*2 may be formed around the circumference of the hole 924*a*.

A shock absorber 930 may be disposed in the hole 921*a*. The shock absorber 930 may be referred to as a pusher 930, a lifter 930, an absorber 930, or a damper 930.

Figure 12:
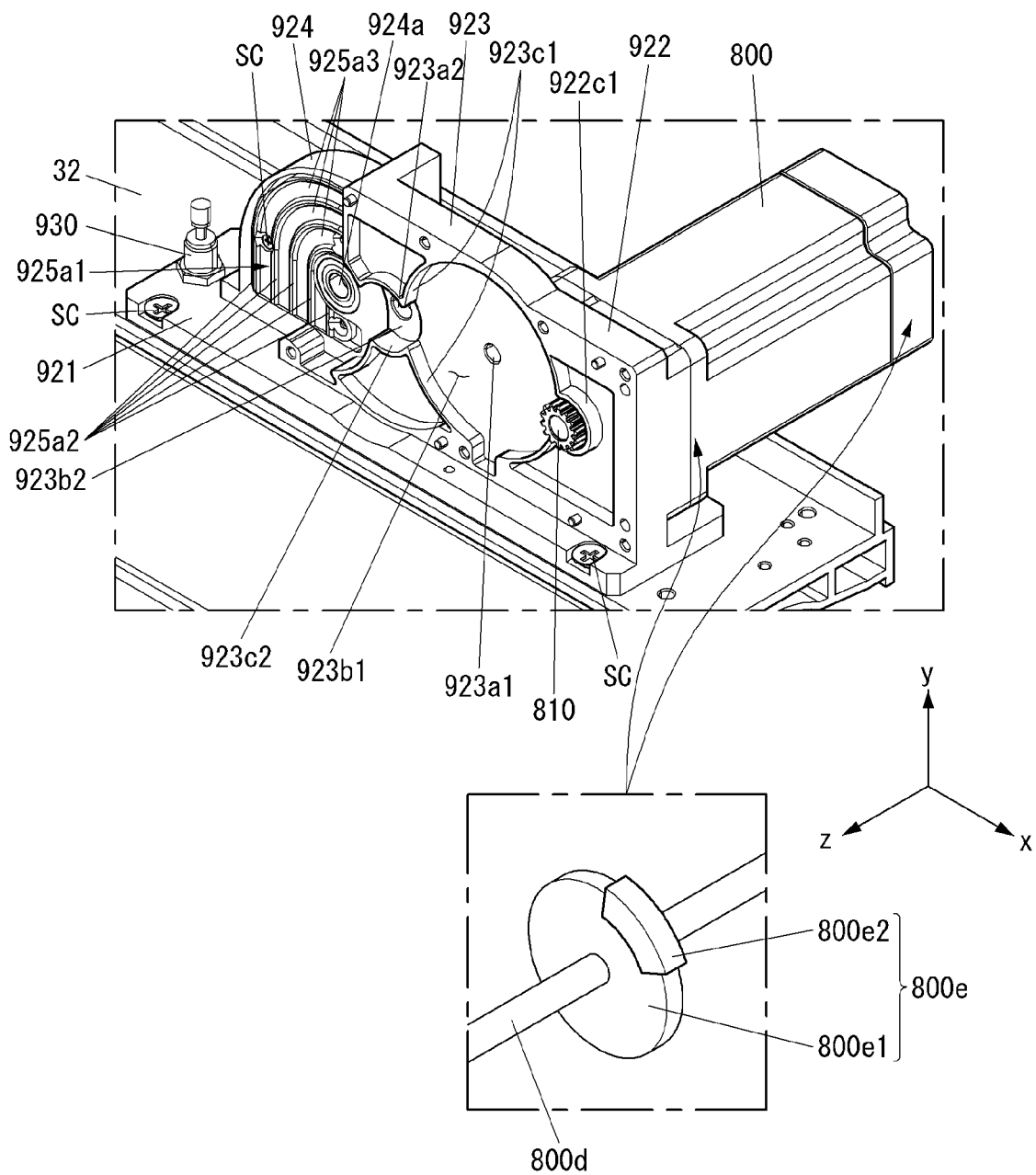

Referring to FIG. 12, a motor 800 may be fastened to a rear surface of the motor mount 922. The motor 800 may be fixed to the motor mount 922. A drive shaft 800*d* of the motor 800 may be inserted into the hole 922*a*. The drive shaft 800*d* may be referred to as an axis of rotation. The drive shaft 800*d* of the motor 800 may be coupled to a gear 810. The gear 810 may rotate together with the drive shaft 800*d* as the drive shaft 800*d* of the motor 800 rotates. The gear 810 may be positioned in an accommodation space 922*b*. The wall 922*c*1 may surround the gear 810.

A guide plate 925*a*1 may be fastened to a front surface of the link mount 924 through fastening members SC. The guide plate 925*a*1 may be fixed to the accommodation space 924*b*1. The guide plate 925*a*1 may include a plurality of guides 925*a*2. The guide plate 925*a*1 may include guide grooves 925*a*3 between the neighboring guides 925*a*2. A lubricating oil may be applied to the guide plate 925*a*1.

A brake 800*e* may be disposed inside the motor 800, in front of the motor 800, or in the rear of the motor 800. When the brake 800*e* is disposed in the rear of the motor 800, the drive shaft 800*d* may pass through the motor 800, and the motor 800 may be disposed on the drive shaft 800*d*. The brake 800*e* may include a disk 800*e*1 and a caliper 800*e*2. The disk 800*e*1 may be coupled to the drive shaft 800*d*. Alternatively, the disc 800*e*1 may be integrally formed with the drive shaft 800*d*. The caliper 800*e*2 can brake the rotation of the disk 800*e*1 by grasping the disk 800*e*1. The caliper 800*e*2 may include a pad that contacts or separates from the disc 800*e*1. The pad can brake the rotation of the disk 800*e*1 by contacting the disk 800*e*1 and generating a frictional force.

Figure 13:
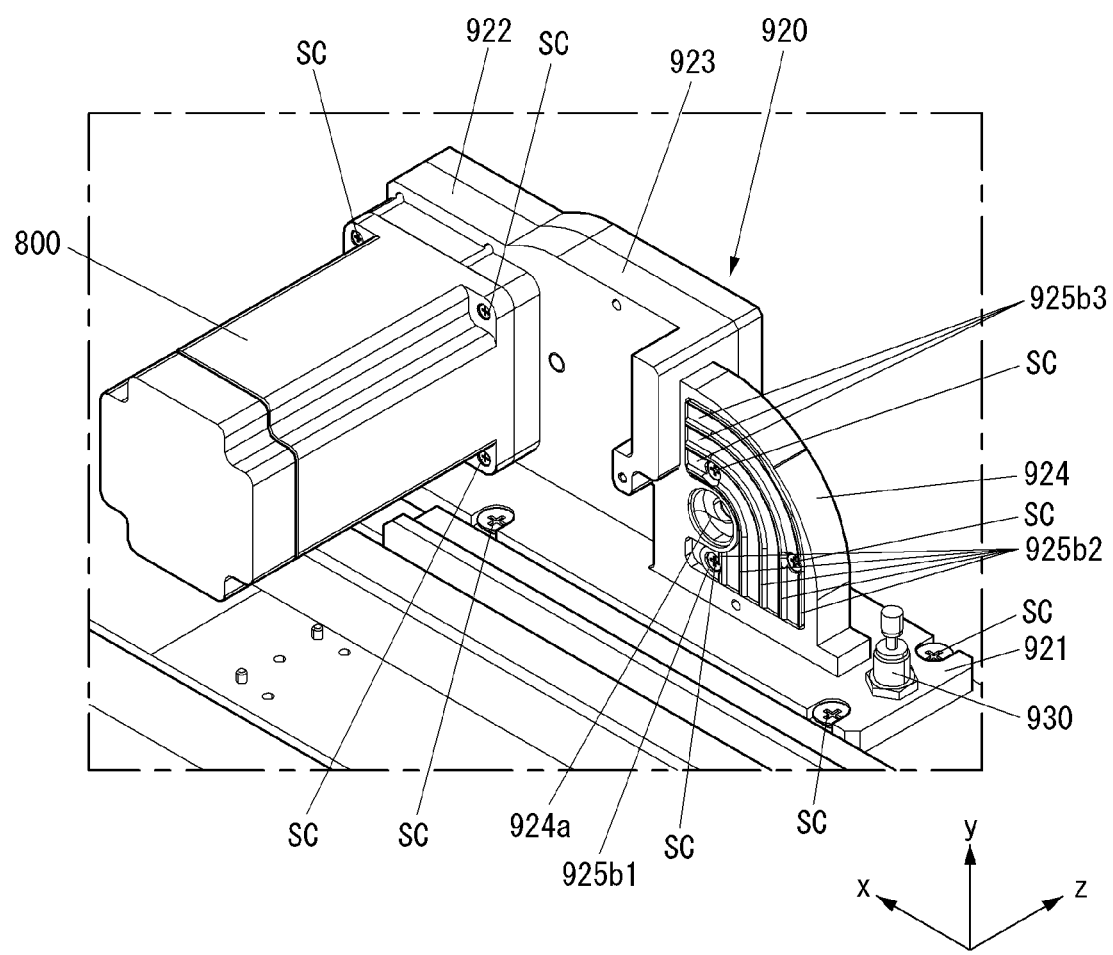

Referring to FIG. 13, the motor 800 may be fastened to the wall 922*c*2 by fastening members SC. A guide plate 925*b*1 may be fastened to a rear surface of the link mount 924 through the fastening members SC. The guide plate 925*b*1 may be fixed to the accommodation space 924*b*2. The guide plate 925*b*1 may include a plurality of guides 925*b*2. The guide plate 925*b*1 may include guide grooves 925*b*3 between the neighboring guides 925*b*2.

Figure 14:
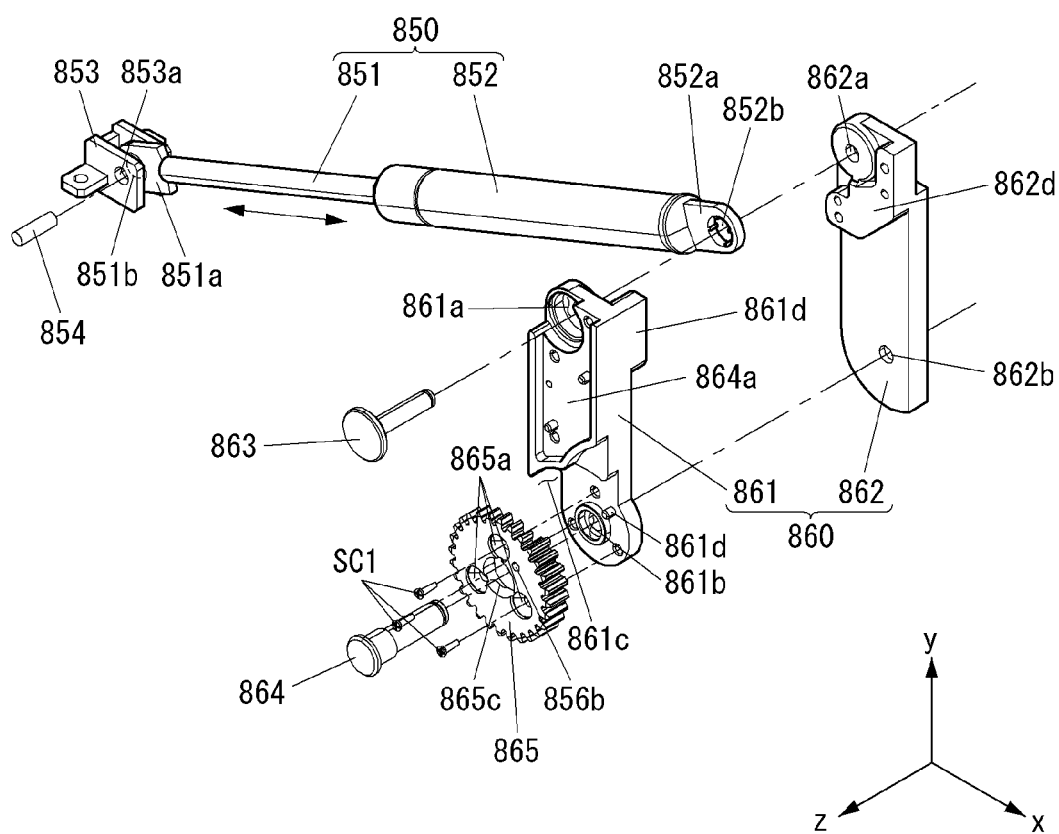

Referring to FIG. 14, a gas spring 850 may include a cylinder 852 and a piston 851. The piston 851 may linearly reciprocate along the cylinder 852. The piston 851 may enter the inside of the cylinder 852 or come out of the cylinder 852. The cylinder 852 may include gas therein. The gas may be sealed by the cylinder 852 and the piston 851. When the piston 851 enters the inside of the cylinder 852, the gas may be compressed. When the gas is compressed, the gas may provide a restoring force to the piston 851. The restoring force may be a force that allows the gas to expand. When the gas is compressed, the gas may push out the piston 851. The gas spring 850 may be replaced by an oil hydraulic cylinder, a pneumatic cylinder (or an air cylinder), or an actuator. The piston 851 may include a coupling portion 851*a* at one end. The coupling portion 851*a* may include a hole 851*b*. A mount 853 may include a hole 853*a*. The coupling portion 851*a* may be coupled to the mount 853. A rotation axis 854 may pass through the hole 853*a*. The rotation axis 854 may be fixed to the mount 853. Alternatively, the rotation axis 854 may rotate around the mount 853. The piston 851 may rotate about the rotation axis 854. Alternatively, the piston 851 may be fixed to the rotation axis 854 and may rotate around the mount 853 together with the rotation axis 854. The other end of the piston 851 may be positioned inside the cylinder 852. The cylinder 852 may include a coupling portion 852*a* at one end. The coupling portion 852*a* may include a hole 852*b*.

A link 860 may include a first part 861 and a second part 862. The first part 861 may have a bar shape. The first part 861 may include a hole 861*a* at one end. The first part 861 may include a hole 861*b* at the other end. The first part 861 may include a stepped portion 861*c* formed along the circumference of the hole 861*b*. The first part 861 may include a protrusion 861*d* protruding in the −z-axis direction. The protrusion 861*d* may be adjacent to the hole 861*b*.

The stepped portion 861*c* may include a plurality of holes 865*a*. The plurality of holes 865*a* may surround a hole 865*c*. A gear 865 may be fastened to the stepped portion 861*c* by fastening members SC1. The gear 865 may be fixed to the stepped portion 861*c*. The plurality of fastening members SC1 may pass through the gear 865 and may be coupled to the plurality of holes 865*a*. The gear 865 may include a hole 861*c*. The stepped portion 861*c* may include a protrusion 861*d* protruding in the +z-axis direction. The protrusion 861*d* may be inserted into a hole 865*b*. The protrusion 861*d* may guide a coupling location of the gear 865.

The second part 862 may have a bar shape. The second part 862 may include a hole 862*a* at one end. The second part 862 may include a hole 862*b* at the other end. The second part 862 may include a protrusion 862*d* protruding in the +z-axis direction. The protrusion 862*d* may be adjacent to the hole 862*b*.

The first part 861 and the second part 862 may be fastened to each other by the fastening members. The first part 861 may face the second part 862. The holes 861a and 862a may face each other. The holes 861b and 862b may face each other. The protrusions 861d and 862d may contact each other. A rotation axis 863 may pass through the holes 861a, 852b, and 862a. The rotation axis 863 may pass through the first part 861, the coupling portion 852a, or the second part 862. The link 860 may rotate or pivot about the rotation axis 863. Alternatively, the rotation axis 863 may be fixed to the link 860. The cylinder 852 may rotate about the rotation axis 863. Alternatively, the cylinder 852 may be fixed to the rotation axis 863, and the cylinder 852 together with the rotation axis 863 may rotate about the link 860. The rotation axis 864 may pass through the holes 865c, 861b, and 862b. The rotation axis 864 may be referred to as an axis of pivot. The rotation axis 864 may pass through the gear 865, the first part 861, or the second part 862. The link 860 may rotate about the rotation axis 864. Alternatively, the rotation axis 864 may be fixed to the link 860. The first part 861 and the second part 862 may be integrally formed. The pivot axis 864 of the link 860 and the rotation axis 864 of the gear 865 may be identical or aligned.

Figure 15:
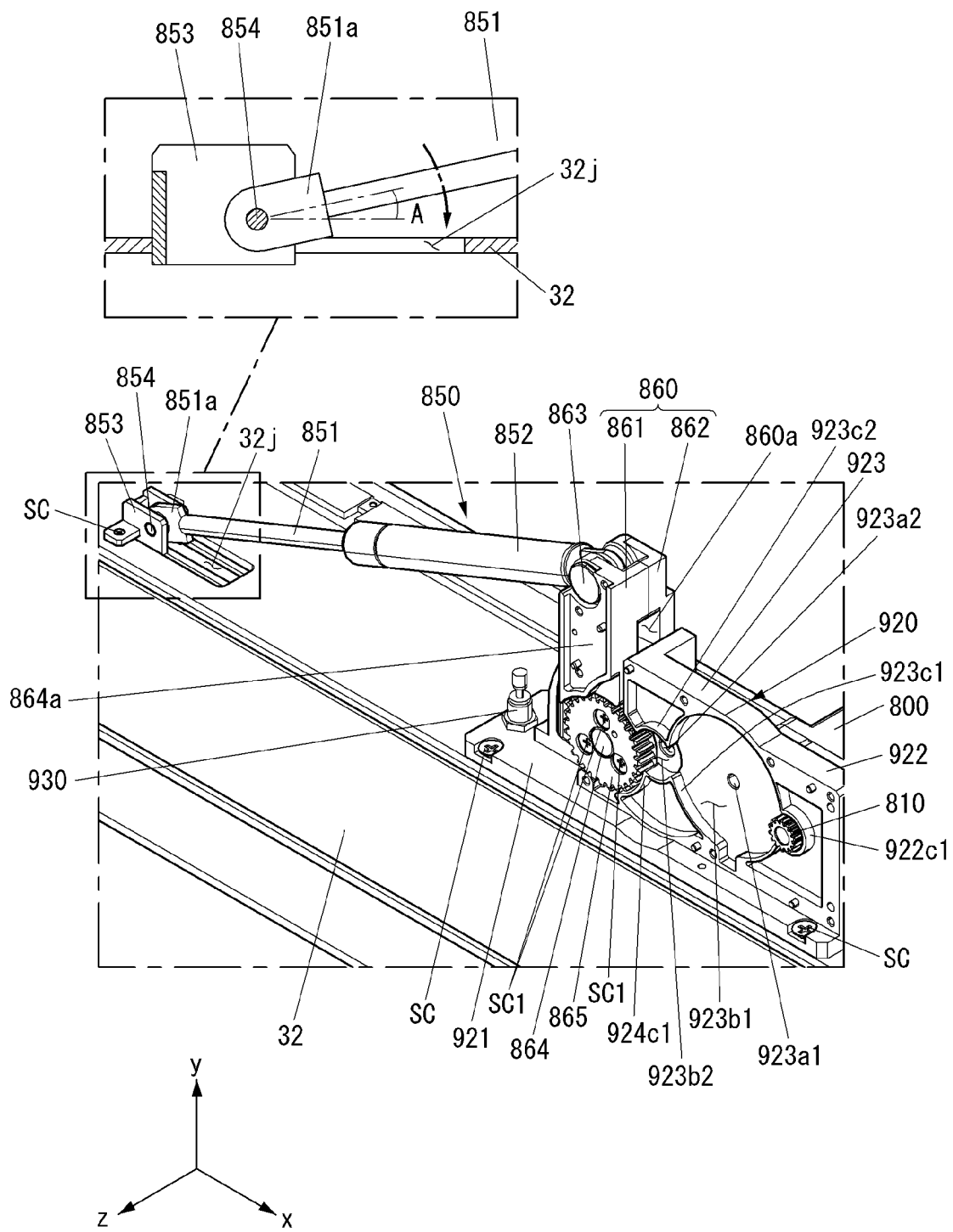

Referring to FIG. 15, a gap 860a may be formed between the first part 861 and the second part 862. The link mount 924 or the guide plates 925a1 and 925b1 may be positioned in the gap 860a. The rotation axis 864 may pass through the link mount 924 or the guide plates 925a1 and 925b1. The rotation axis 864 may pass through the hole 924a. The link 860 may rotate about the rotation axis 864. The link 860 may rotate or pivot about the link mount 924. The guide plate may guide the rotation or the pivot of the link. A lubricating oil may be applied to the guide plate 925b1. The lubricating oil can reduce a friction between the guide plates 925a1 and 925b1 and the link 860.

A hole 32j may be formed on the upper surface of the base 32. The hole 32j may be positioned on the left side of a mount 920. The hole 32j may penetrate the base 32 in the y-axis direction. The mount 853 may be disposed in the hole 32j. At least a portion of the mount 853 may be positioned in the hole 32j. The mount 853 may be installed or fixed to the base 32 by the fastening members SC. The piston 851 may rotate or pivot about the base 32.

When an angle "A" between the piston 851 and the base 32 decreases, at least a portion of the coupling portion 851a or at least a portion of the piston 851 may be positioned in the hole 32j.

Figure 16:
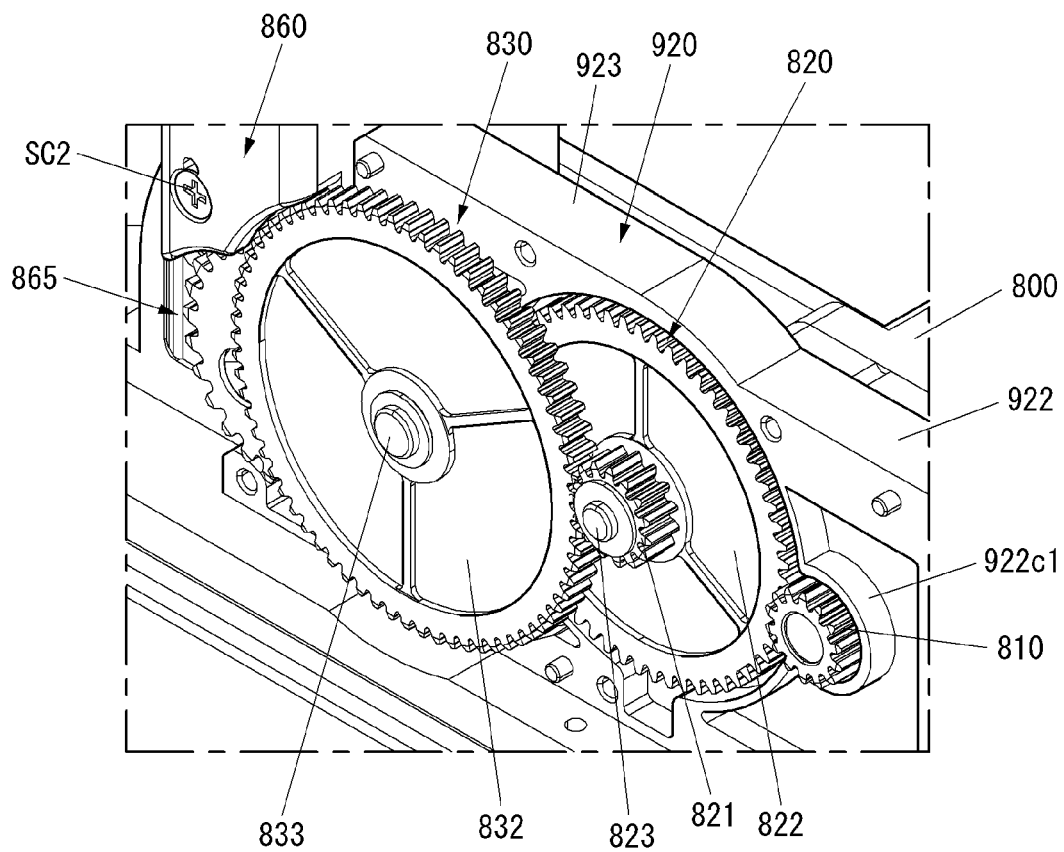

Referring to FIG. 16, gears 810, 820, 830, and 865 may be spur gears. The gear 820 may be installed on the gear mount 923. The gear 820 may be accommodated in the accommodation space 923b1. The wall 923c1 may surround the gear 820. A rotation axis 823 may be inserted into the hole 923a1. The rotation axis 823 may rotate about the gear mount 923. Alternatively, the rotation axis 823 may be fixed to the gear mount 923. The gear 820 may be coupled to the rotation axis 823. The gear 820 may rotate about the rotation axis 823. Alternatively, the gear 820 may be fixed to the rotation axis 823. Alternatively, the gear 820 may be integrally formed with the rotation axis 823. The gear 820 may be a double gear. The gear 820 may include a primary gear 821 and a secondary gear 822. A rotation axis 823 of the primary gear 821 and a rotation axis 823 of the secondary gear 822 may be identical. The primary gear 821 and the secondary gear 822 may be integrally formed. The secondary gear 822 may have a larger diameter than the primary gear 821. The secondary gear 822 may have more sawteeth than the primary gear 821. The secondary gear 822 may be engaged with the gear 810. The secondary gear 822 may be accommodated in the accommodation space 923b1. The wall 923c1 may surround the secondary gear 822.

The gear 830 may be installed on the gear mount 923. The gear 830 may be accommodated in the accommodation space 923b2. The wall 923c2 may surround the gear 830. A rotation axis 833 may be inserted into the hole 923a2. The rotation axis 833 may rotate about the gear mount 923. Alternatively, the rotation axis 833 may be fixed to the gear mount 923. The gear 830 may be coupled to the rotation axis 833. The gear 830 may rotate about the rotation axis 833. Alternatively, the gear 830 may be fixed to the rotation axis 833. Alternatively, the gear 830 may be integrally formed with the rotation axis 833. The gear 830 may be a double gear. The gear 830 may include a primary gear 831 (see FIG. 17) and a secondary gear 832. A rotation axis 833 of the primary gear 831 and a rotation axis 833 of the secondary gear 832 may be identical. The primary gear 831 and the secondary gear 832 may be integrally formed. The secondary gear 832 may have a larger diameter than the primary gear 831. The secondary gear 832 may have more sawteeth than the primary gear 831. The secondary gear 832 may be engaged with the gear 820. The secondary gear 832 may be engaged with the primary gear 821. The primary gear 831 may be accommodated in the accommodation space 923b2. The wall 923c2 may surround the primary gear 831.

Figure 17:
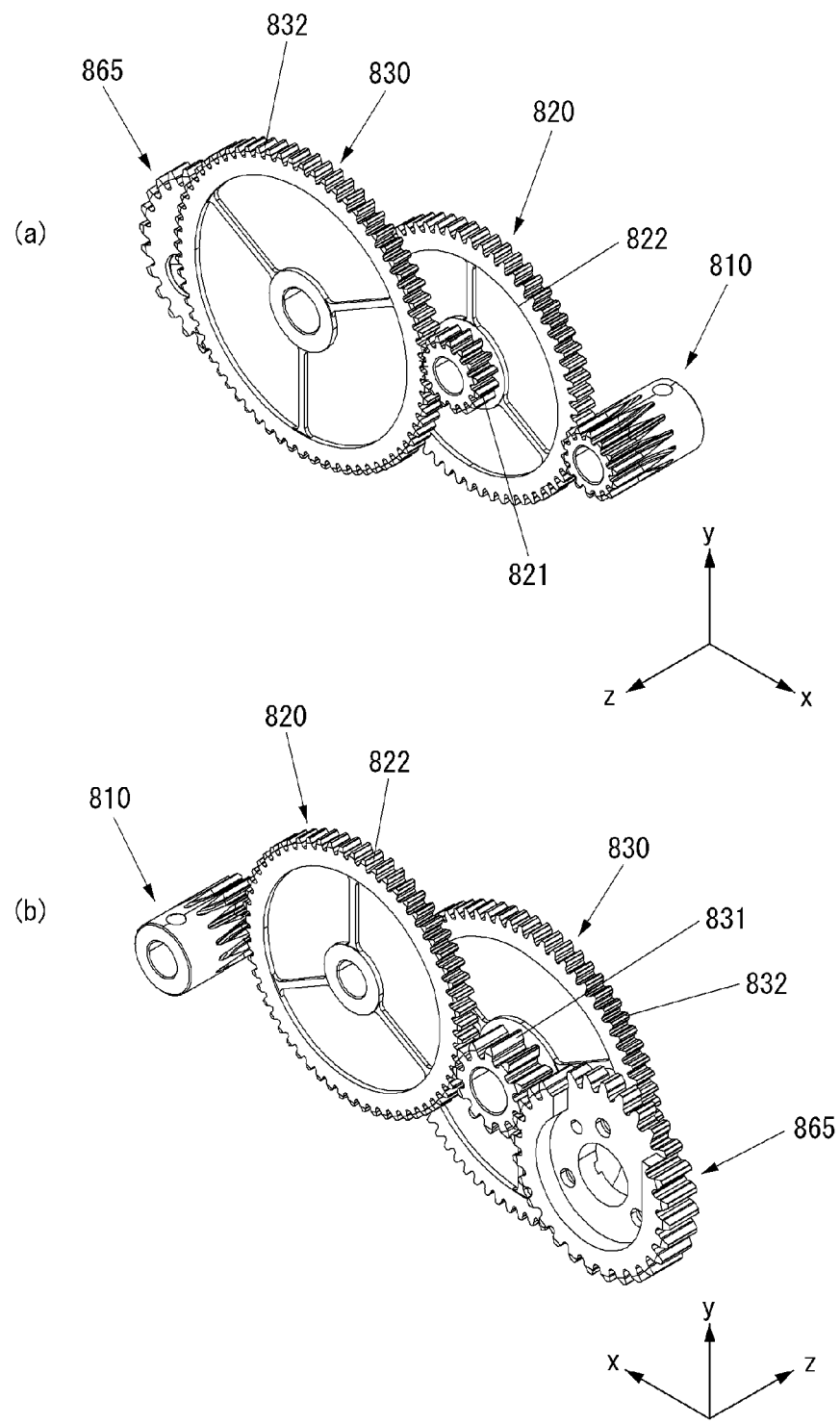

Referring to FIG. 17, a torque output from the motor 800 may be transferred to the fourth gear 865 through the first gear 810, the second gear 820, and the third gear 830. As the torque is transferred to the fourth gear 865, the link 860 fastened to the fourth gear 865 may rotate or pivot.

The first gear 810 may be engaged with the secondary gear 822 of the second gear 820. The secondary gear 822 may have more sawteeth than the first gear 810. For example, the number of teeth of the first gear 810 may be 14, and the number of teeth of the secondary gear 822 may be 60. A gear reduction ratio (or a gear ratio or a reduction ratio) of the first gear 810 and the secondary gear 822 may be 4.29. Alternatively, the gear reduction ratio of the first gear 810 and the secondary gear 822 may be 3 to 6.

The primary gear 821 of the second gear 820 may be engaged with the secondary gear 832 of the third gear 830. The secondary gear 832 may have more sawteeth than the primary gear 821. For example, the number of teeth of the primary gear 821 may be 15, and the number of teeth of the secondary gear 832 may be 70. A gear reduction ratio of the primary gear 821 and the secondary gear 832 may be 4.67. Alternatively, the gear reduction ratio of the primary gear 821 and the secondary gear 832 may be 3 to 6.

The primary gear 831 of the third gear 830 may be engaged with the fourth gear 865. The fourth gear 865 may have more sawteeth than the primary gear 831. For example, the number of teeth of the fourth gear 865 may be 26, and the number of teeth of the primary gear 831 may be 12. A gear reduction ratio of the fourth gear 865 and the primary gear 831 may be 2.17. Alternatively, the gear reduction ratio of the fourth gear 865 and the primary gear 831 may be 3 to 6.

A gear reduction ratio from the first gear 810 to the fourth gear 865 may be a multiplication of the gear reduction ratio of the second gear 820 to the first gear 810, the gear reduction ratio of the third gear 830 to the second gear 820, and the gear reduction ratio of the fourth gear 865 to the third gear 830. For example, the gear reduction ratio from the first gear 810 to the fourth gear 865 may be 4.29*4.67*2.17=43.33. The first gear 810 to the fourth gear 865 can rotate or pivot the link 860 by amplifying the torque of the motor 800.

For example, a diameter of the first gear 810 may be 11.5 mm, a diameter of the primary gear 821 of the second gear 820 may be 11.5 mm, a diameter of the secondary gear 822 of the second gear 820 may be 57.5 mm, a diameter of the primary gear 831 of the third gear 830 may be 14.25 mm, a diameter of the secondary gear 832 of the third gear 830 may be 67.5 mm, and a diameter of the fourth gear 865 may be 39 mm.

For example, a diameter of the first gear 810 may be 14 mm, a diameter of the primary gear 821 of the second gear 820 may be 14 mm, a diameter of the secondary gear 822 of the second gear 820 may be 60 mm, a diameter of the primary gear 831 of the third gear 830 may be 18 mm, a diameter of the secondary gear 832 of the third gear 830 may be 70 mm, and a diameter of the fourth gear 865 may be 42 mm.

For example, a diameter of the first gear 810 may be 16 mm, a diameter of the primary gear 821 of the second gear 820 may be 16 mm, a diameter of the secondary gear 822 of the second gear 820 may be 62 mm, a diameter of the primary gear 831 of the third gear 830 may be 21 mm, a diameter of the secondary gear 832 of the third gear 830 may be 72 mm, and a diameter of the fourth gear 865 may be 45 mm.

Figure 18:
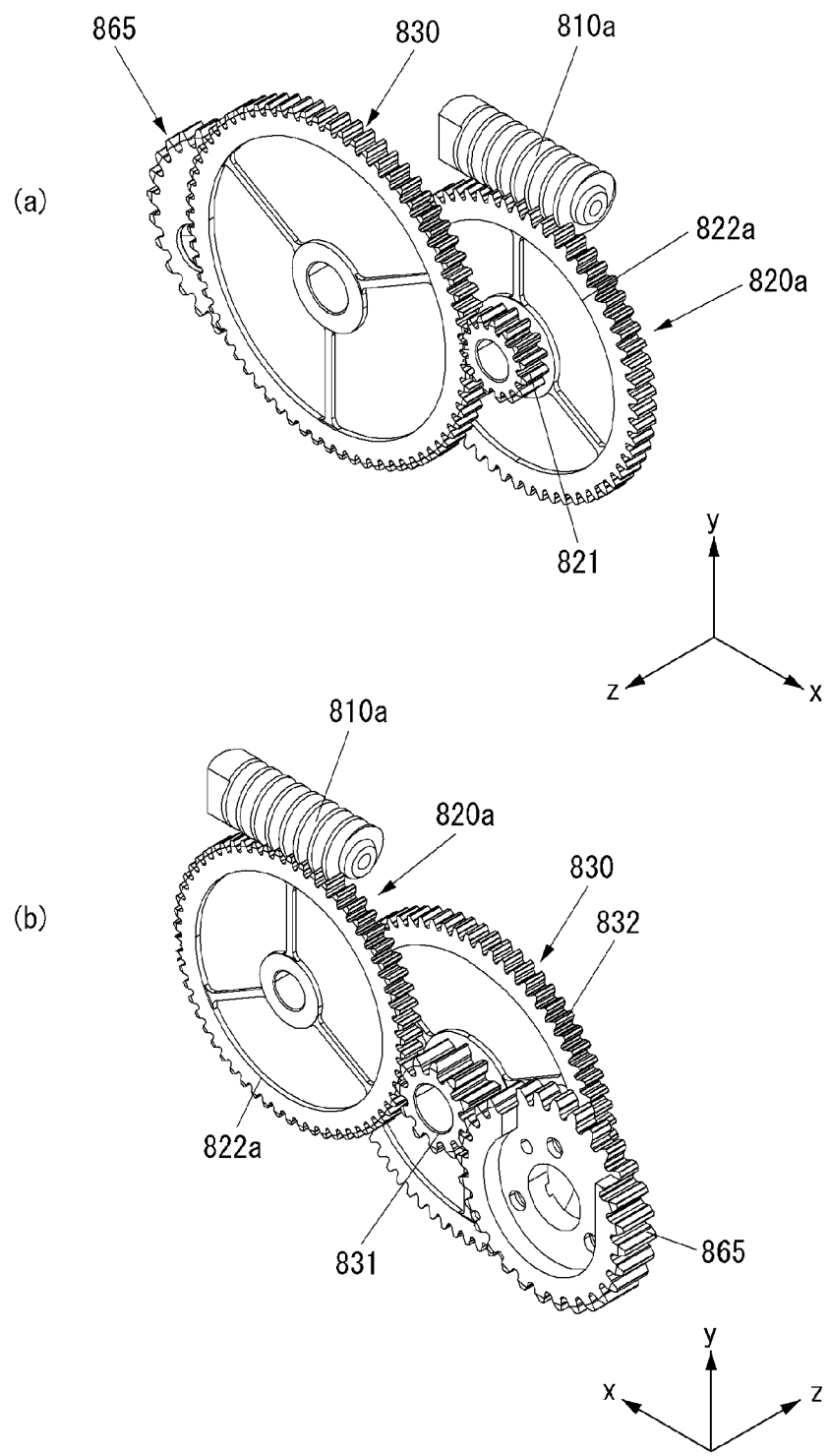

Referring to FIG. 18, a first gear 810*a* may be a worm gear. A secondary gear 822*a* of a second gear 820*a* may be a worm wheel gear. A gear reduction ratio of the first gear 810*a* and the second gear 820*a* may be greatly increased by applying the worm gear and the worm wheel gear. In this instance, the gear reduction ratio may mean the number of revolutions of the first gear 810*a* during one revolution of the secondary gear 822*a*. The motor 800 can be installed in a direction parallel to the x-axis by applying a bevel gear.

Figure 19:
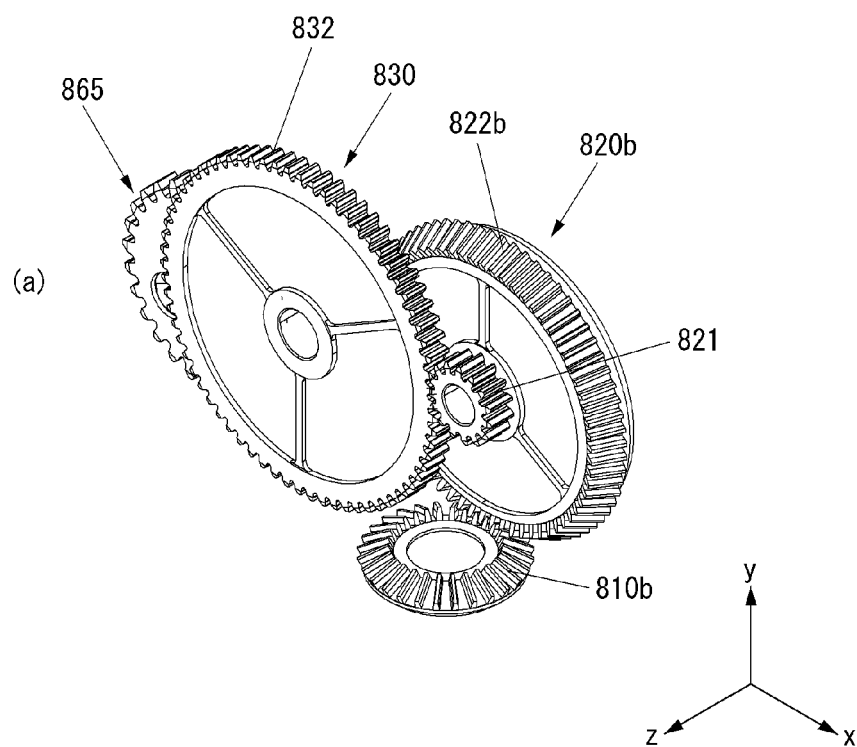
Figure 19:
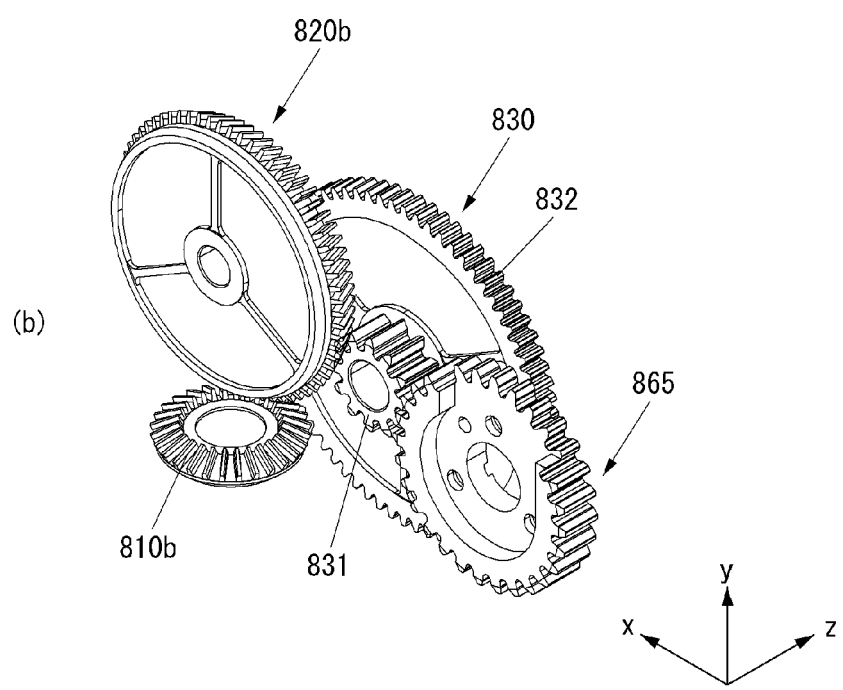

Referring to FIG. 19, a first gear 810*b* and a secondary gear 822*b* of a second gear 820*b* may be a bevel gear. The motor 800 can be installed in a direction parallel to the x-axis by applying the worm gear and the worm wheel gear.

Figure 20:
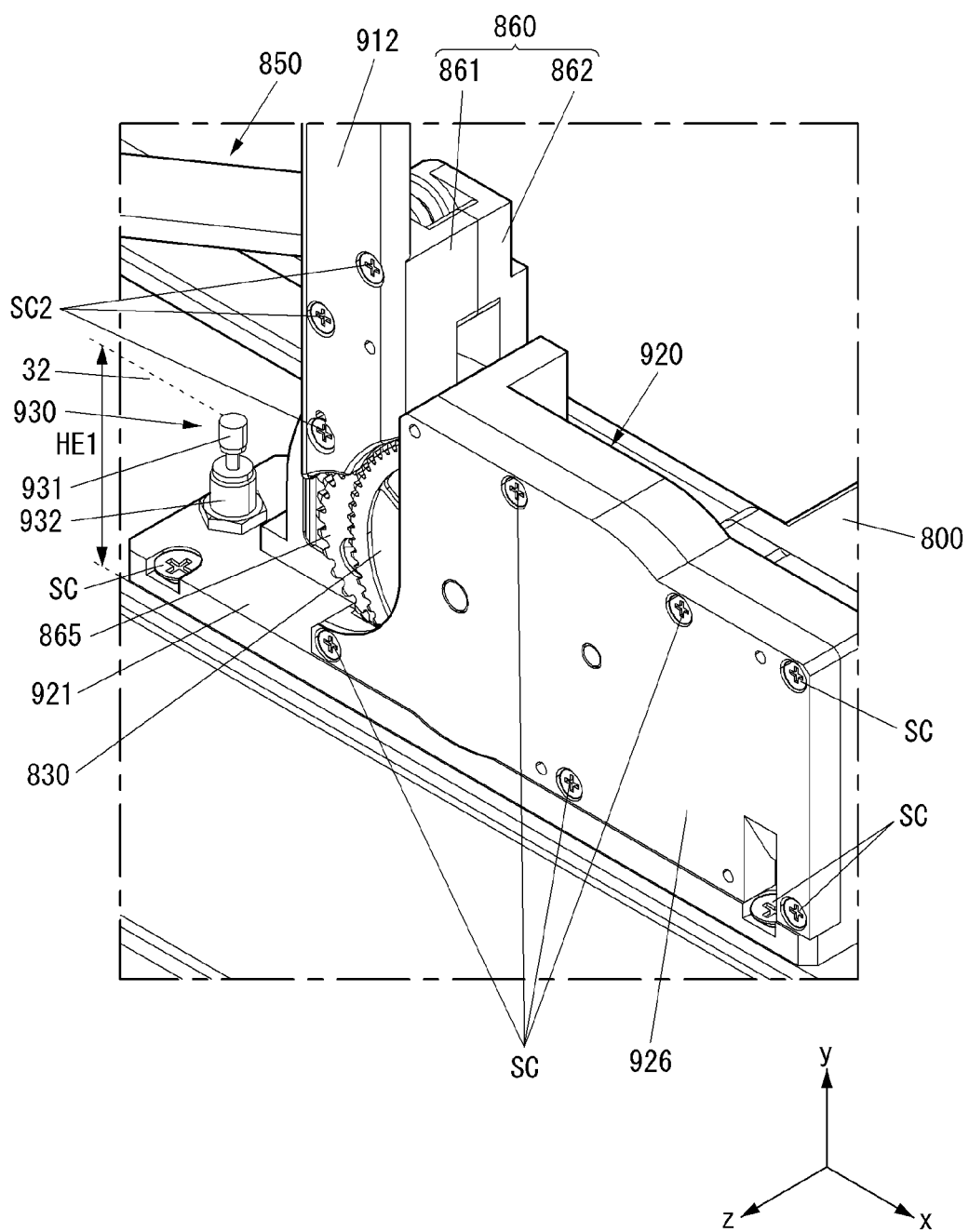

Referring to FIG. 20, a lower link 912 may be fastened to the front surface of the link 860 by fastening members SC2. The lower link 912 may be fixed to the front surface of the link 860. Alternatively, the lower link 912 and the link 860 may be integrally formed. A cover 926 may be fastened to a front surface of the mount 920 by fastening members SC. The cover 926 may cover the gears 810, 820, 830, and 885.

Figure 21:
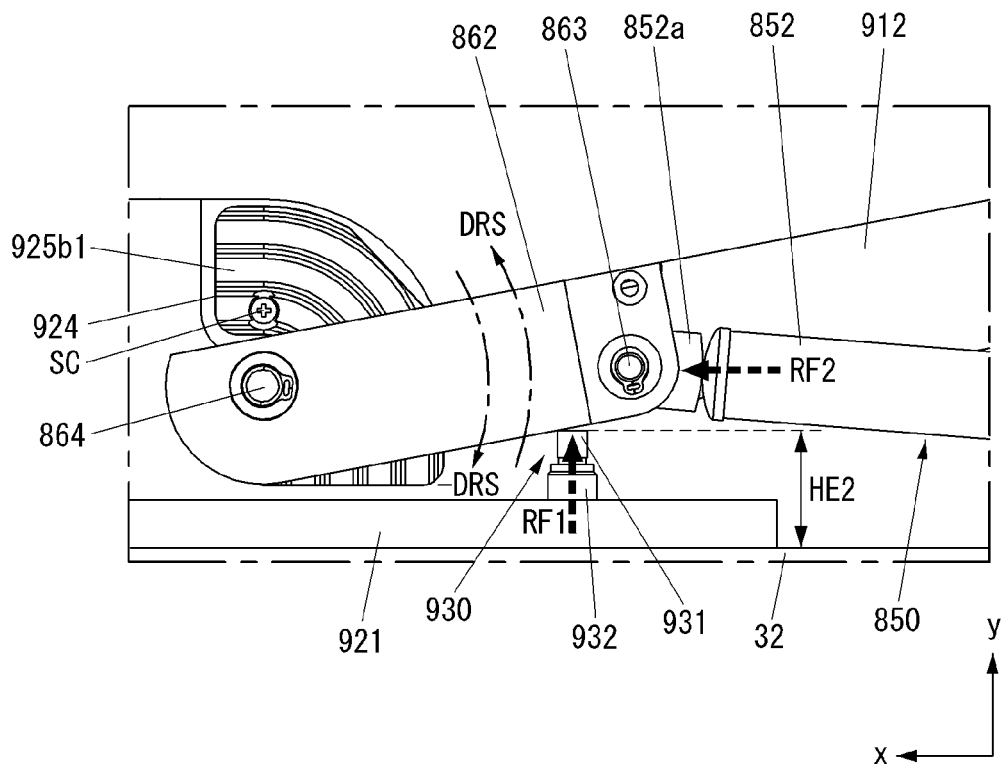

Referring to FIG. 21, a shock absorber 930 may include a cylinder 932 and a piston 931. The piston 931 may move up and down in the y-axis direction. When the link 860 rotates in a direction − DRS approaching the coupling portion 921, the piston 931 may be in contact with the link 860. When the link 860 rotates in the direction − DRS approaching the coupling portion 921, the shock absorber 930 may serve as a damper for reducing an impact. When the link 860 and the piston 931 contact each other, the shock absorber 930 may provide a restoring force RF1 to the link 860. The restoring force RF1 may act in the +y-axis direction. When the link 860 and the piston 931 contact each other, the shock absorber 930 may provide the restoring force RF1 so that the link 860 rotates in a direction DRS away from the coupling portion 921. When the link 860 and the shock absorber 930 do not contact each other, the shock absorber 930 may have a maximum height HE1 (see FIG. 20) from the base 32.

When the piston 931 is inserted into the cylinder 932 to the maximum, a height HE2 of the shock absorber 930 from the base 32 may be the minimum. The shock absorber 930 may limit an angle at which the link 860 rotates or pivots. When the link 860 contacts the piston 931 and a height HE of the piston 931 is the minimum, an angle "B" between the gas spring 850 and the base 32 may be the minimum. When the link 860 contacts the piston 931 and the piston 931 has a minimum height, an angle "C" between the link 860 and the base 32 may be the minimum. The gas spring 850 may provide a restoring force RF2 to the link 860. As the lower link 912 and an upper link 911 are folded, the shock absorber 930 may contact the lower link 912. Alternatively, as the lower link 912 and the upper link 911 are folded, the lower link 912 may press the shock absorber 930.

Figure 22:
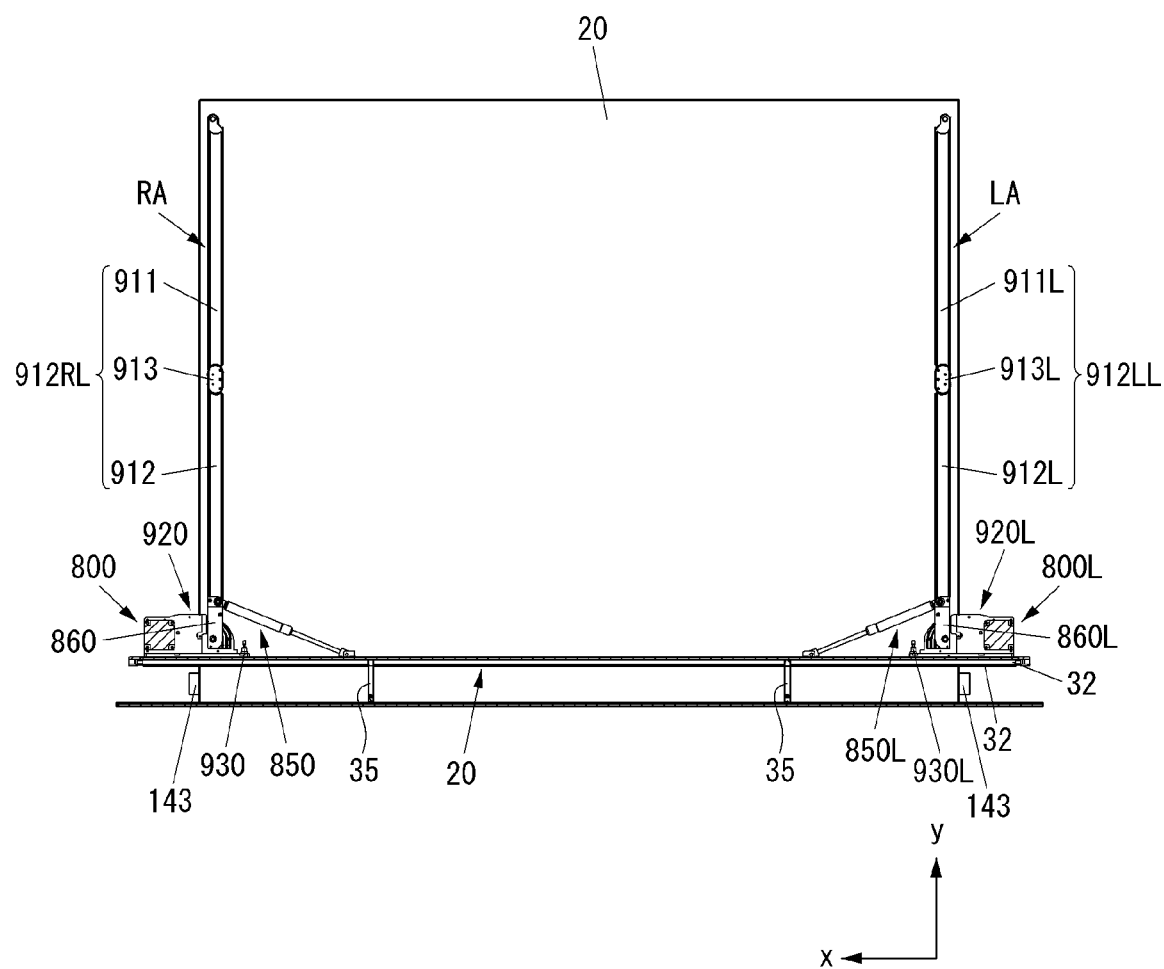

Referring to FIG. 22, a right assembly RA may include the mount 920, the cover 926, the motor 800, the gears 810, 820, 830 and 865, the gas spring 850, the shock absorber 930, or a link 912RL. The link 912RL may include the lower link 912, the upper link 911, or a joint 913. The link 912RL may be referred to as a foldable link 912RL, a lift 912RL, a lift assembly 912RL, a foldable lift 912RL, or a foldable lift assembly 912RL.

A left assembly LA may include the same components as the right assembly RA. The left assembly LA and the right assembly RA may be symmetrical. The left assembly LA may include a mount 920L, a cover 926L, a motor 800L, a gear, a gas spring 850L, a shock absorber 930L, or a link 912LL. The link 912LL may include a lower link 912L, an upper link 911L, or a joint 913L. The link 912LL may be referred to as a foldable link 912LL, a lift 912LL, a lift assembly 912LL, a foldable lift 912LL, or a foldable lift assembly 912LL. The links 912RL and 912LL may be folded or unfolded.

A first base 31 may have a plate shape. The first base 31 may face the second base 32. The first base 31 may be positioned below the second base 32. A supporter 35 may be positioned between the first base 31 and the second base 32. The supporter 35 may be fastened to the first base 31 by a fastening member. The supporter 35 may be fastened to the second base 32 by a fastening member. A roller 143 may be disposed on the first base 31. The roller 143 may be positioned between the first base 31 and the second base 32. A part of the display unit 20 may be rolled on the roller 143, and a part of the display unit 20 may be unrolled from the roller 143. The display unit 20 unrolled from the roller 143 may be extended upward.

Figure 23:
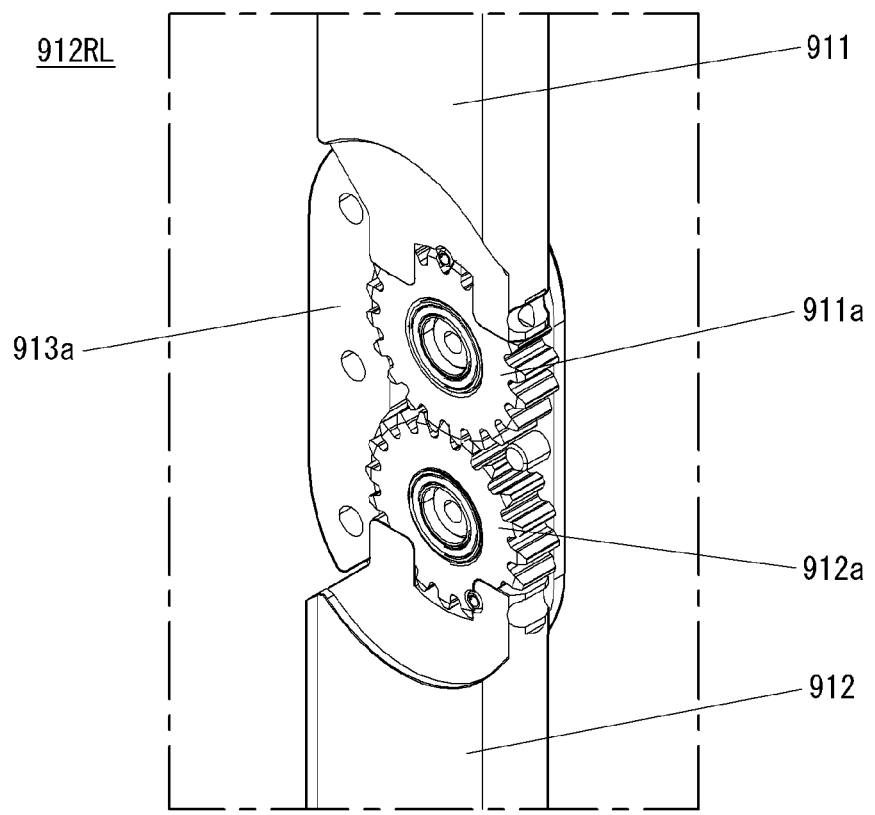

Referring to FIG. 23, a gear 912*a* may be formed at an upper end of the upper link 912. Alternatively, the gear 912*a* may be coupled to the upper end of the upper link 912. Alternatively, the gear 912*a* may be fixed to the upper end of the upper link 912. Alternatively, the gear 912*a* may be integrally formed with the upper link 912. A gear 911*a* may be formed at a lower end of the lower link 911. Alternatively, the gear 911*a* may be coupled to the lower end of the lower link 911. Alternatively, the gear 911*a* may be fixed to the lower end of the lower link 911. Alternatively, the gear 911*a* may be integrally formed with the lower link 911. The gears 912*a* and 911*a* may be engaged with each other. The gears 911*a* and 912*a* may rotate about a first part 913*a* of the joint 913. The upper link 912 may be referred to as an arm 912. The lower link 911 may be referred to as an arm 911.

Figure 24:
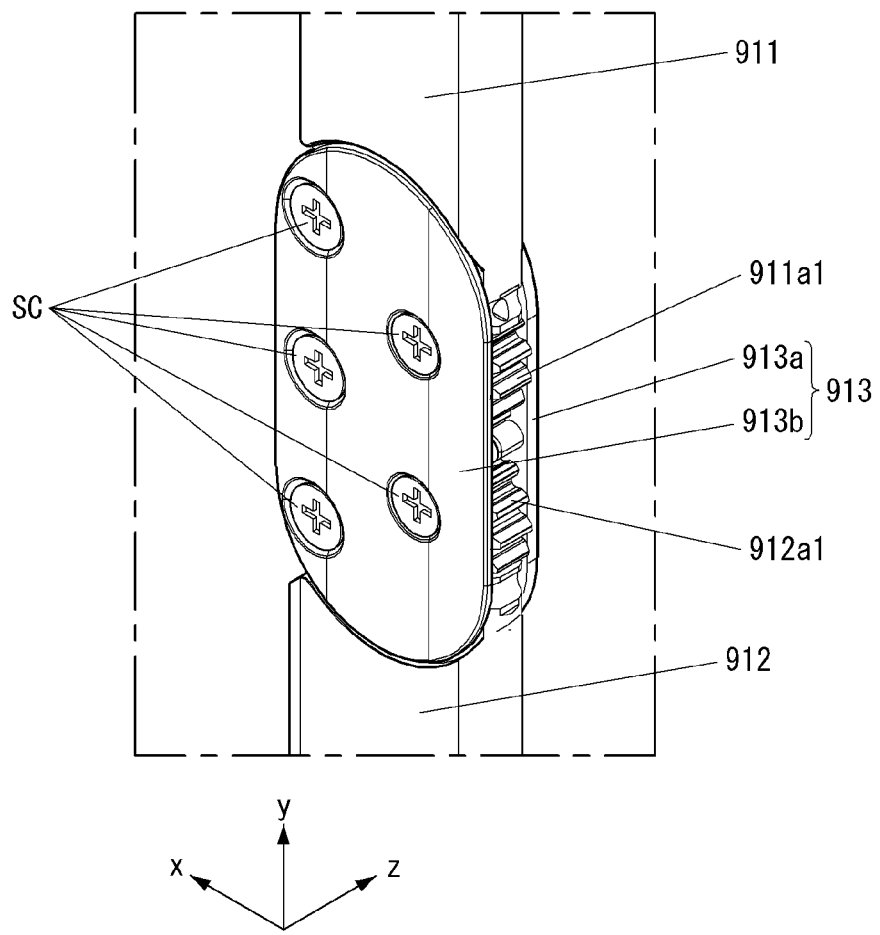

Referring to FIG. 24, a second part 913*b* of the joint 913 may be fastened to the first part 913*a* by fastening members SC. The second part 913*b* may be fixed to the first part 913*a*. The gears 911*a* and 912*a* may rotate about the first part 913*a* or the second part 913*b*.

Figure 25:
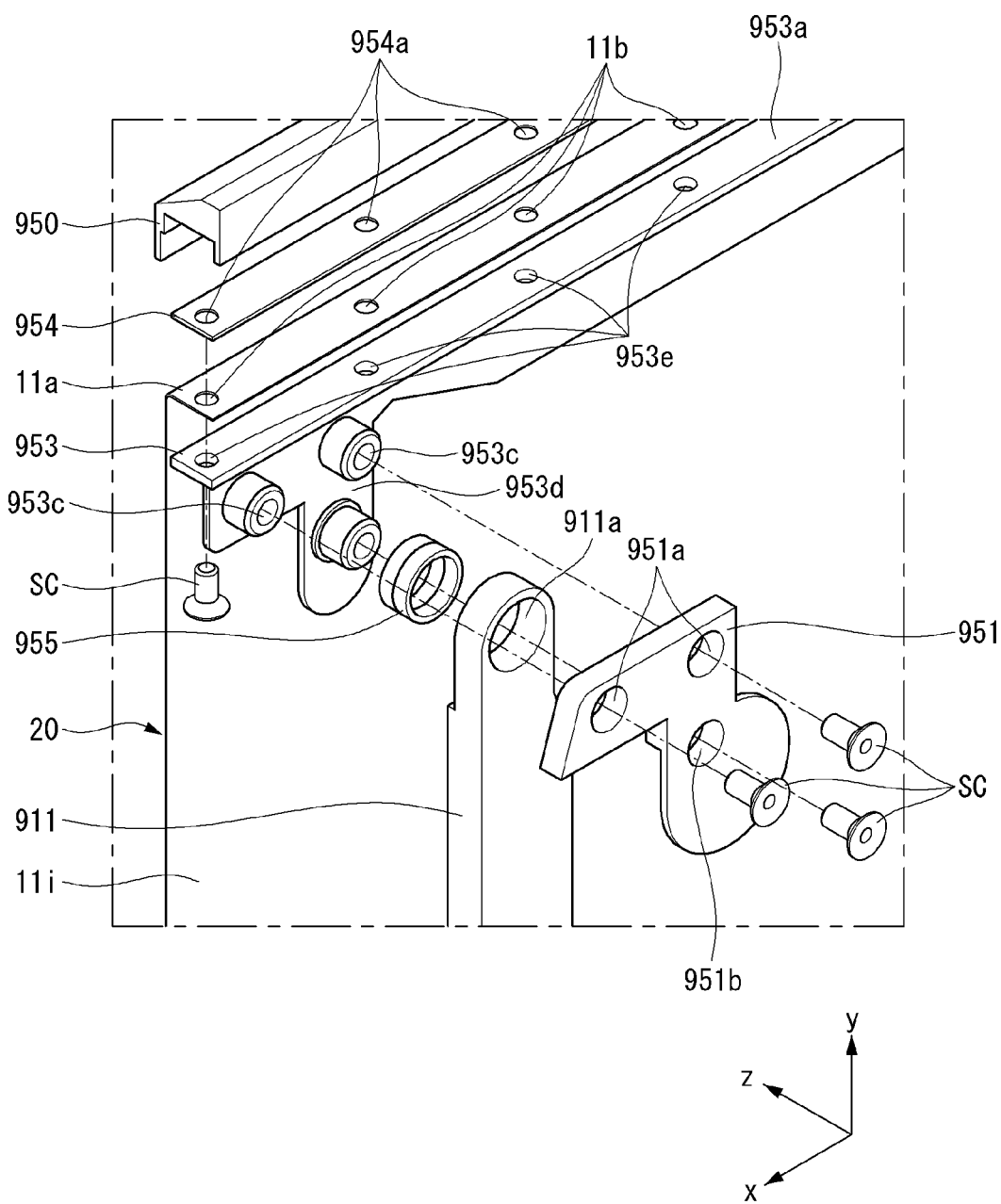

Referring to FIG. 25, an upper part of the display unit 20 may be bent rearward. The upper part of the display unit 20 may be a plate 11 that is not coupled to the display panel 10. An upper part of the plate 11 bent rearward may be referred to as a bending part 11a or a first part 11a. A part coupled to the bending part 11a may be referred to as a second part 11i. A top case 950 may be positioned on the bending part 11a. A gasket 954 may be positioned between the top case 950 and the bending part 11a. A lower bar 953 may be positioned below the bending part 11a. The lower bar 953 may be referred to as a bar 953. The lower bar 953 may include a horizontal portion 953a and a vertical portion 953b. The gasket 954 may include holes 954a. The bending part 11a may include holes 11b. The horizontal portion 953a may include holes 953e. The holes 954a of the gasket 954, the holes 11b of the bending part 11a, and the holes 953e of the horizontal portion 953a may face each other. The fastening members SC may pass through the holes 953e of the horizontal portion 953a, the holes 11b of the bending part 11a, and the holes 954a of the gasket 954 and may be fastened to the top case 950. The vertical portion 953b may be positioned perpendicular to the horizontal portion 953a. The vertical portion 953b may support the plate 11. The vertical portion 953b may face a link bracket 951. The vertical portion 953b may include a first coupling portion 953c and a second coupling portion 953d that protrude rearward. The second coupling portion 953d may be inserted into a bearing 955. The bearing 955 may be referred to as a ring bearing 955. The bearing 955 may be inserted into a hole 911a of the first arm 911. The link bracket 951 may include a first hole 951a and a second hole 951b. The fastening member SC may pass through the first hole 951a and may be fastened to the first coupling portion 953c. The fastening member SC may pass through the second hole 951b and may be fastened to the second coupling portion 953d. The link bracket 951 may be fixed to the lower bar 953 by the first hole 951a, the first coupling portion 953c, and the fastening members SC. The first arm 911 may be pivotally coupled to the lower bar 953 by the second coupling portion 953d, the bearing 955, the second hole 951b, and the fastening member SC. With the above structure, a wrinkle W or a crease W of the display unit 20 can be reduced. The upper link 911a may rotate or pivot about the second coupling portion 953d or the link bracket 951.

Figure 26:
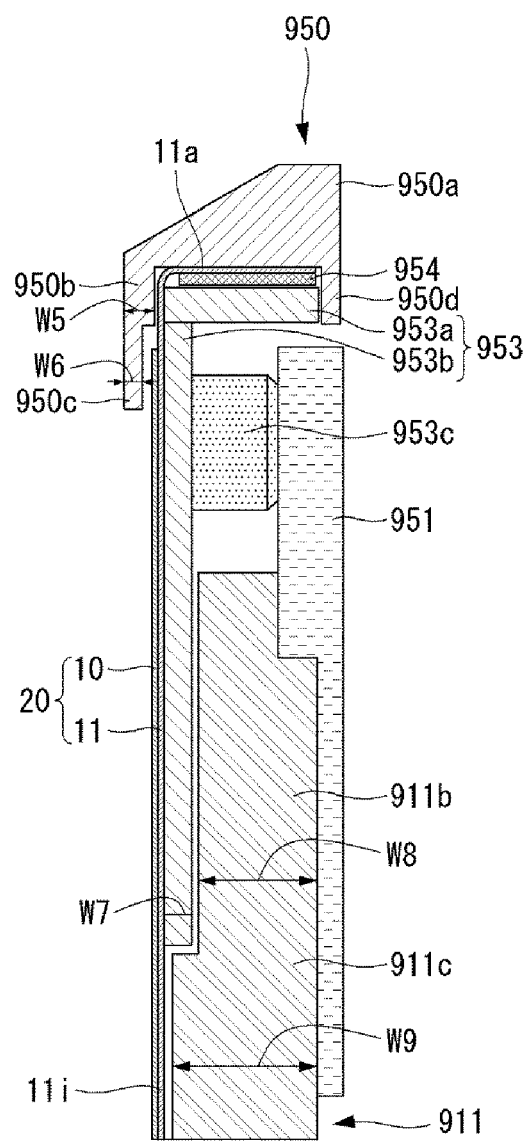

Referring to FIG. 26, a rear wall 950d may extend to a lower portion of the first part 950a. The rear wall 950d may be referred to as a second part 950d. The rear wall 950d may cover the bending part 11a, the gasket 954, or the horizontal portion 953a. A first front wall 950b may extend to the lower portion of the first part 950a. The first front wall 950b may be referred to as a third part 950b. The first front wall 950b may cover an upper part of the plate 11 or the second part 11i. A second front wall 950c may extend to a lower portion of the first front wall 950b. The second front wall 950c may be referred to as a fourth part 950c. The second front wall 950c may cover the upper part of the display panel 10. The second front wall 950c can cover a wrinkle W or a crease W that may occur on the upper part of the display panel 10. A thickness W5 of the first front wall 950b may be greater than a thickness W6 of the second front wall 950c. The thickness W5 of the first front wall 950b may be substantially equal to a sum of the thickness W6 of the second front wall 950c and a thickness of the display panel 10.

The first arm 911 may include a first part 911b facing the vertical portion 953b and a second part 911c facing the plate 11. A thickness W9 of the second part 911c may be substantially equal to a sum of a thickness W7 of the vertical portion 953b and a thickness W8 of the first part 911b. The second part 911c can stably support the display unit 20 by contacting or adjoining the display unit 20.

Figure 27:
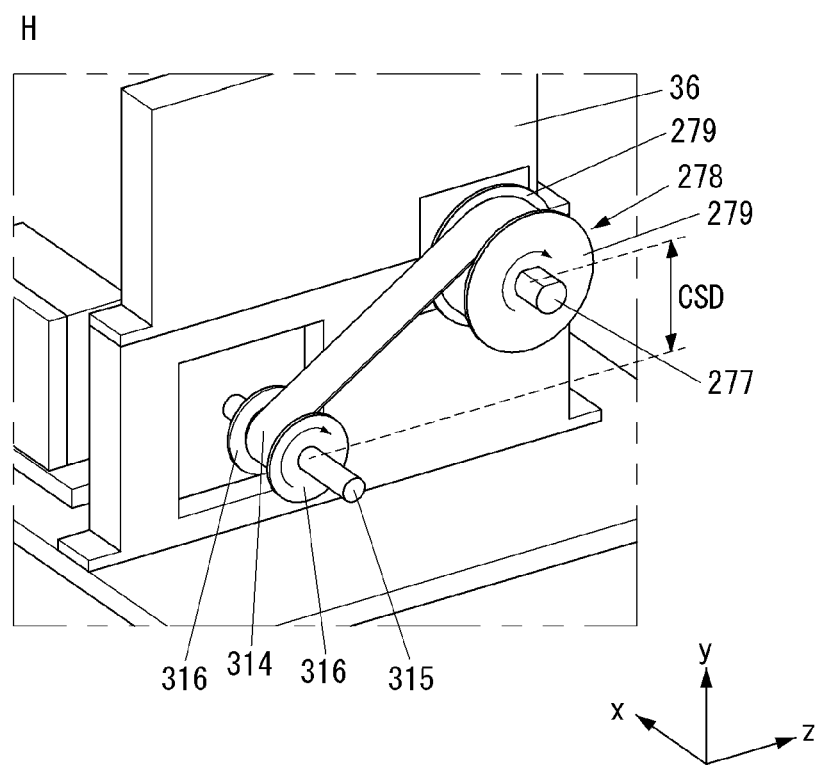

Referring to FIG. 27, the roller 143 may be mounted on the mount 36. The mount 36 may be disposed on the base 31. The mount 36 may be provided at one end and the other end of the roller 143 in the longitudinal direction (or the x-axis direction) of the roller 143. The roller 143 may be positioned between the mounts 36. The roller 143 may rotate about the mount 36. A hub 278 may be mounted on the mount 36. The mount 36 may be positioned between the roller 143 and the hub 278. The hub 278 may be coupled or fixed to one end of the roller 143. The hub 278 may be integrally formed with the roller 143. As the roller 143 rotates, the hub 278 may rotate. A rotation speed of the roller 143 may be equal to a rotation speed of the hub 278.

A rotation axis 315 may be mounted on the mount 36. The rotation axis 315 may rotate about the mount 36. A spring 314 may be wound around the rotation axis 315. The spring 314 may be a constant force spring. The spring 314 may be wound on the rotation axis 315 a plurality of times. One end of the spring 314 may be fixed to the rotation axis 315. The other end of the spring 314 may be fixed to the hub 278. The spring 314 may extend toward the hub 278 and may be wound or unwound around the hub 278. The spring 314 may be wound on or unwound from the rotation axis 315 and may provide a restoring force to the hub 278. The restoring force may be a force that is intended to wind the spring 314 on the rotation axis 315. A guide 316 may guide the spring 314 to be wound or unwound from the rotation axis 315. When the spring 314 is wound on or unwound from the rotation axis 315, a rotation direction of the rotation axis 315 may be same as a rotation direction of the hub 278.

The rotation axis 315 may be positioned below the hub 278 by a distance CSD in the y-axis direction. As the rotation axis 315 is positioned below the hub 278, a larger force can be transferred to the hub 278 than when the rotation axis 315 is positioned at the same height as the hub 278 or on the hub 278. The display unit 20 can be rolled on the roller 143 due to the restoring force that the spring 314 provides to the hub 278.

Figure 28:
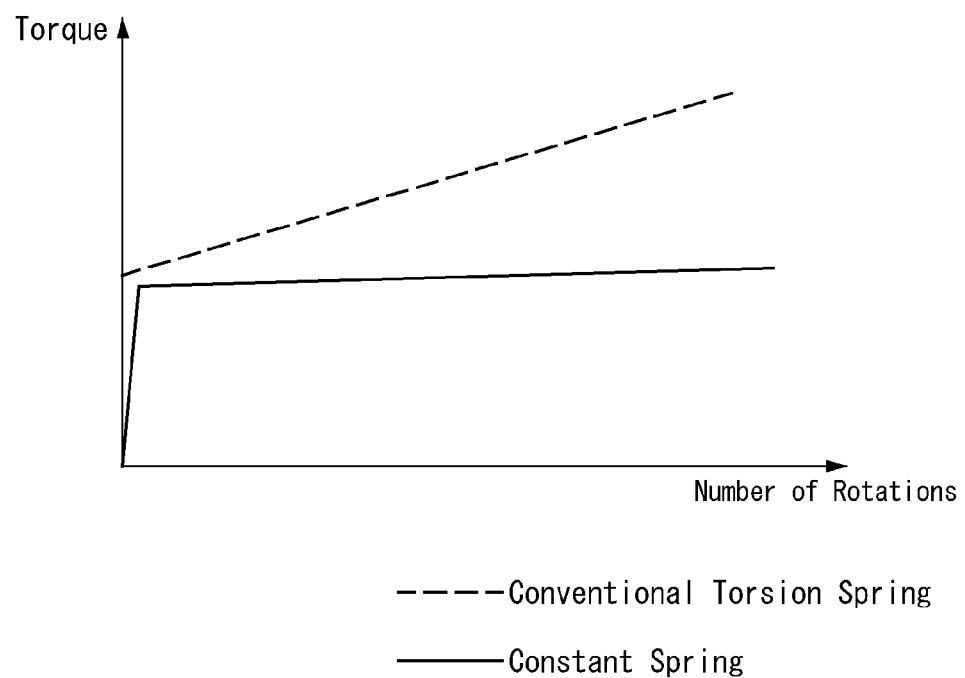

Referring to FIG. 28, as indicated by the dotted line, in the case of an existing torsion spring, a torque applied may increase as the number of revolutions increases. As indicated by the solid line, when the number of revolutions of the spring 314 exceeds a predetermined number of revolutions, a torque applied may be constant. Change in a torque required to roll the display unit 20 on the roller 143 may not be larger than the number of times the display unit 20 is rolled on the roller 143. Thus, there is an advantage that the roller 143 can be stably driven by obtaining a constant torque using a constant spring.

Figure 29:
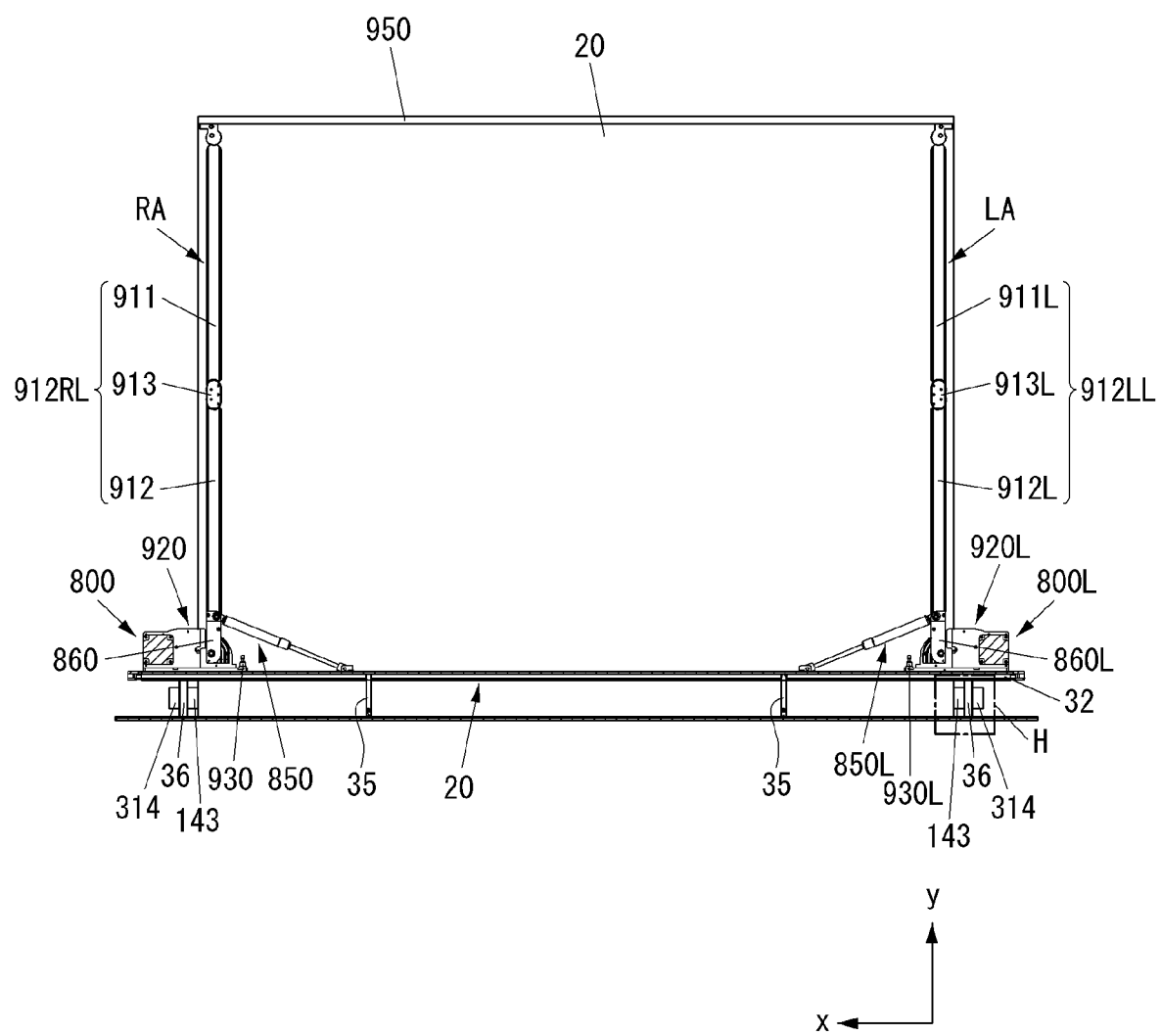

Referring to FIG. 29, a height of the top case 950 in the y-axis direction may be the maximum. When the height of the top case 950 in the y-axis direction is the maximum, an angle "E" between the lower links 912 and 912L and the upper links 911 and 911L may be the maximum. For example, the angle "E" may be 180 degrees. When the height of the top case 950 in the y-axis direction is the maximum, lengths of the gas springs 850 and 850L may be the maximum. When the height of the top case 950 in the y-axis direction is the maximum, the display unit 20 may be unrolled from the roller 143 to the maximum. When the height of the top case 950 in the y-axis direction is the maximum, the shock absorbers 930 and 930L may not contact the links 860 and 860L. When the height of the top case 950 in the y-axis direction is the maximum, heights HE1 of the shock absorbers 930 and 930L may be the maximum.

Figure 30:
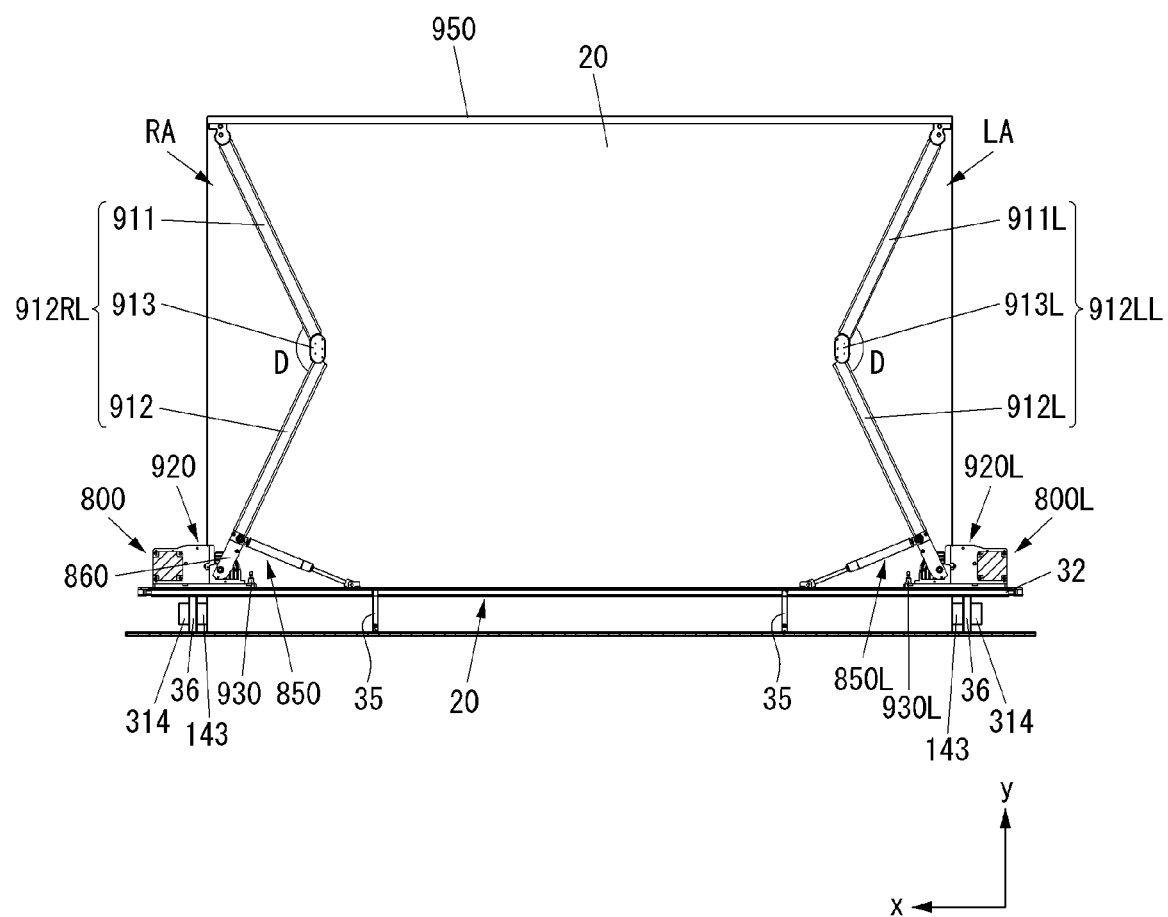

Referring to FIG. 30, the motors 800 and 800L may rotate or pivot the lower links 912 and 912L.

As the motors 800 and 800L rotate or pivot the lower links 912 and 912L in a direction of raising the lower links 912 and 912L with respect to the base 32, an angle "D" between the lower links 912 and 912L and the upper links 911 and 911L may increase. As the motors 800 and 800L rotate or pivot the lower links 912 and 912L in the direction of raising the lower links 912 and 912L with respect to the base 32, an angle between the lower links 912 and 912L and the base 32 may increase. As the motors 800 and 800L rotate or pivot the lower links 912 and 912L in the direction of raising the lower links 912 and 912L with respect to the base 32, the top case 950 may move in the +y-axis direction. As the motors 800 and 800L rotate or pivot the lower links 912 and 912L in the direction of raising the lower links 912 and 912L with respect to the base 32, the display unit 20 may be unrolled from the roller 143. As the motors 800 and 800L rotate or pivot the lower links 912 and 912L in the direction of raising the lower links 912 and 912L with respect to the base 32, lengths of the gas springs 850 and 850L may be extended. The gas springs 850 and 850L may provide a restoring force to the lower links 912 and 912L in the direction of raising the lower links 912 and 912L with respect to the base 32.

As the motors 800 and 800L rotate or pivot the lower links 912 and 912L in the opposite direction of the direction of raising the lower links 912 and 912L with respect to the base 32, the angle "D" between the lower links 912 and 912L and the upper links 911 and 911L may decrease. As the motors 800 and 800L rotate or pivot the lower links 912 and 912L in the opposite direction of the direction of raising the lower links 912 and 912L with respect to the base 32, the angle between the lower links 912 and 912L and the base 32 may increase. As the motors 800 and 800L rotate or pivot the lower links 912 and 912L in the opposite direction of the direction of raising the lower links 912 and 912L with respect to the base 32, the top case 950 may move in the −y-axis direction. As the motors 800 and 800L rotate or pivot the lower links 912 and 912L in the opposite direction of the direction of raising the lower links 912 and 912L with respect to the base 32, the display unit 20 may be rolled on the roller 143. As the motors 800 and 800L rotate or pivot the lower links 912 and 912L in the opposite direction of the direction of raising the lower links 912 and 912L with respect to the base 32, the lengths of the gas springs 850 and 850L may decrease. The gas spring 850 may provide a restoring force to the lower links 912 and 912L in the direction of raising the lower links 912 and 912L with respect to the base 32.

As the motors 800 and 800L rotate or pivot the lower links 912 and 912L in the direction of raising the lower links 912 and 912L, a distance between the joints 913 and 913L may increase. As the motors 800 and 800L rotate or pivot the lower links 912 and 912L in the opposite direction of the direction of raising the lower links 912 and 912L, the distance between the joints 913 and 913L may decrease.

Figure 31:
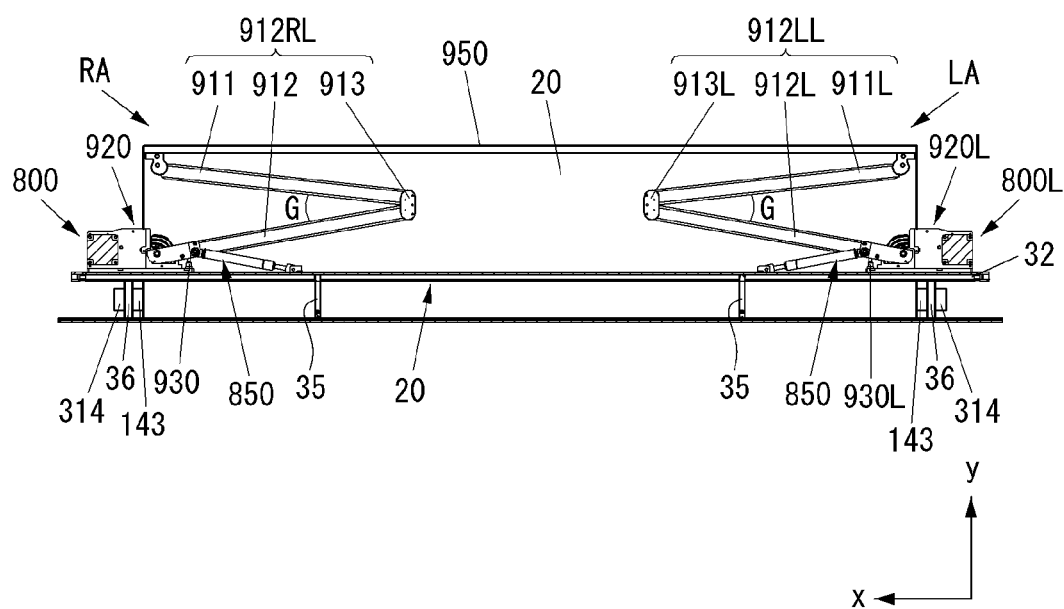

Referring to FIG. 31, a height of the top case 950 in the y-axis direction may be the minimum. When the height of the top case 950 in the y-axis direction is the minimum, an angle "G" between the lower links 912 and 912L and the upper links 911 and 911L may be the minimum. When the height of the top case 950 in the y-axis direction is the minimum, lengths of the gas springs 850 and 850L may be the minimum. When the height of the top case 950 in the y-axis direction is the minimum, the display unit 20 may be rolled on the roller 143 to the maximum. When the height of the top case 950 in the y-axis direction is the minimum, the shock absorbers 930 and 930L may contact the links 860 and 860L. When the height of the top case 950 in the y-axis direction is the minimum, heights HE2 of the shock absorbers 930 and 930L may be the minimum.

Figure 32:
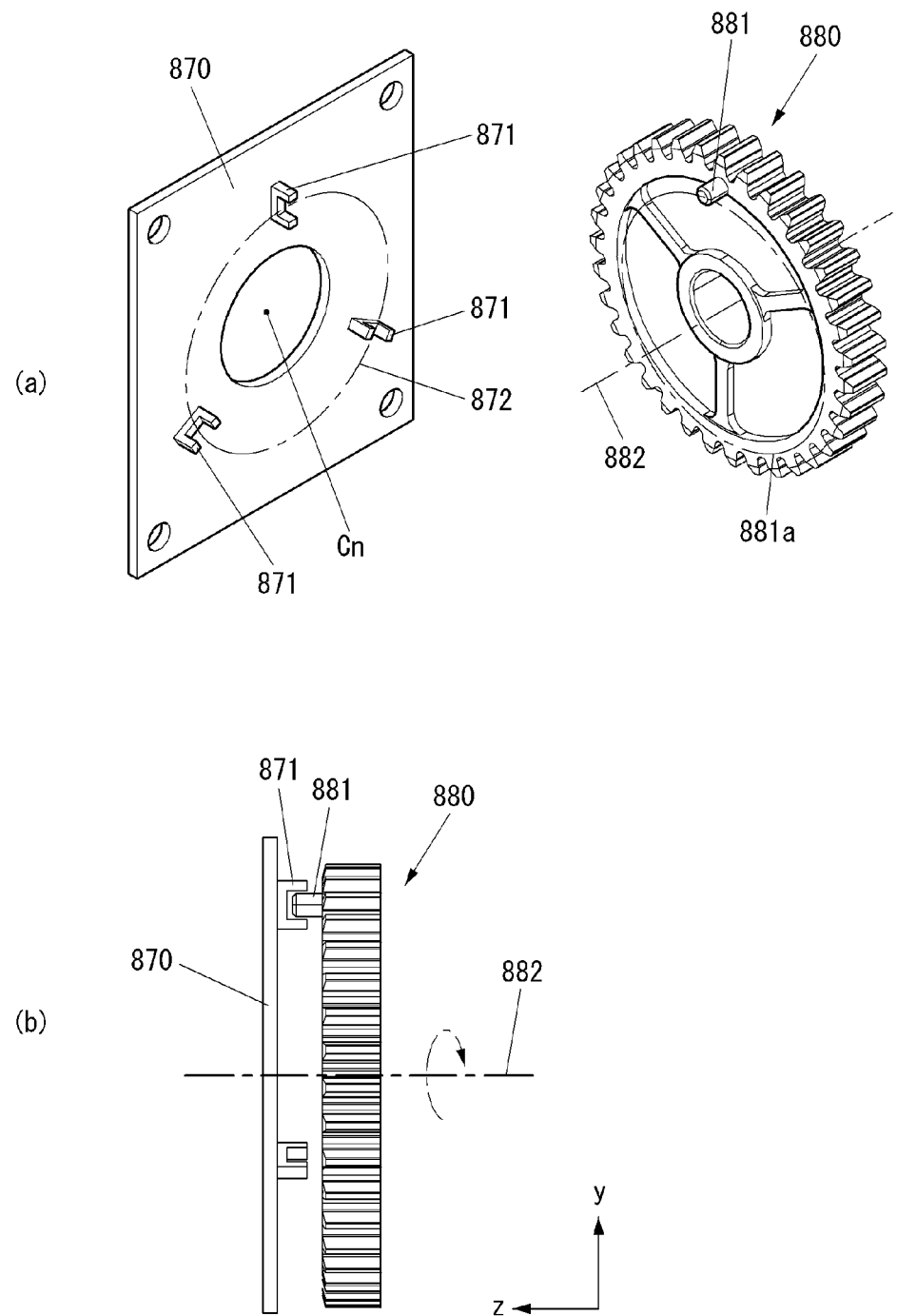

Referring to FIG. 32, a printed circuit board (PCB) 870 may be disposed between the covers 926 and 926L and the mounts 920 and 920L. The PCB 870 may face a gear 880. The PCB 870 may be positioned between the gear 880 and the covers 926 and 926L. The PCB 870 may be included in the left assembly LA or the right assembly RA. The gear 880 may include at least one of the plurality of gears 810, 820, 830, and 865.

The PCB 870 may include a position sensing unit 871. The position sensing unit 871 may protrude toward the gear. The position sensing unit 871 may be provided in plural. The plurality of position sensing units 871 may be disposed along a virtual circular line 872. The plurality of position sensing units 871 may be disposed at regular intervals along the virtual circular line 872. A rotation axis 882 of the gear 880 may pass through a center cn of the virtual circular line 872. The PCB 870 may be referred to as a sensor 870, a position sensor 870, an angle sensor 870, an encoder 870, or a rotary encoder 870.

A protrusion 881 may be formed on one surface or the entire surface of the gear 880. The protrusion 881 may be spaced apart from the rotation axis 882 of the gear 880. The protrusion 881 may be provided in plural. As the gear 880 rotates, the protrusions 881 may form a circular moving line 881a. The moving line 881a may be referred to as a locus 881a, a trace 881a, a rotation trace 881a, or a rotational moving line 881a. The protrusion 881 may also be referred to as a block 881. The PCB 870 may sense the protrusion 881 passing through the position sensing unit 871. As the gear 880 rotates, the protrusions 881 may sequentially pass through the plurality of position sensing units 871. The PCB 870 may sense an amount of rotation, a rotation direction, or a rotation speed of the gear 880 through the position sensing units 871.

Figure 33:
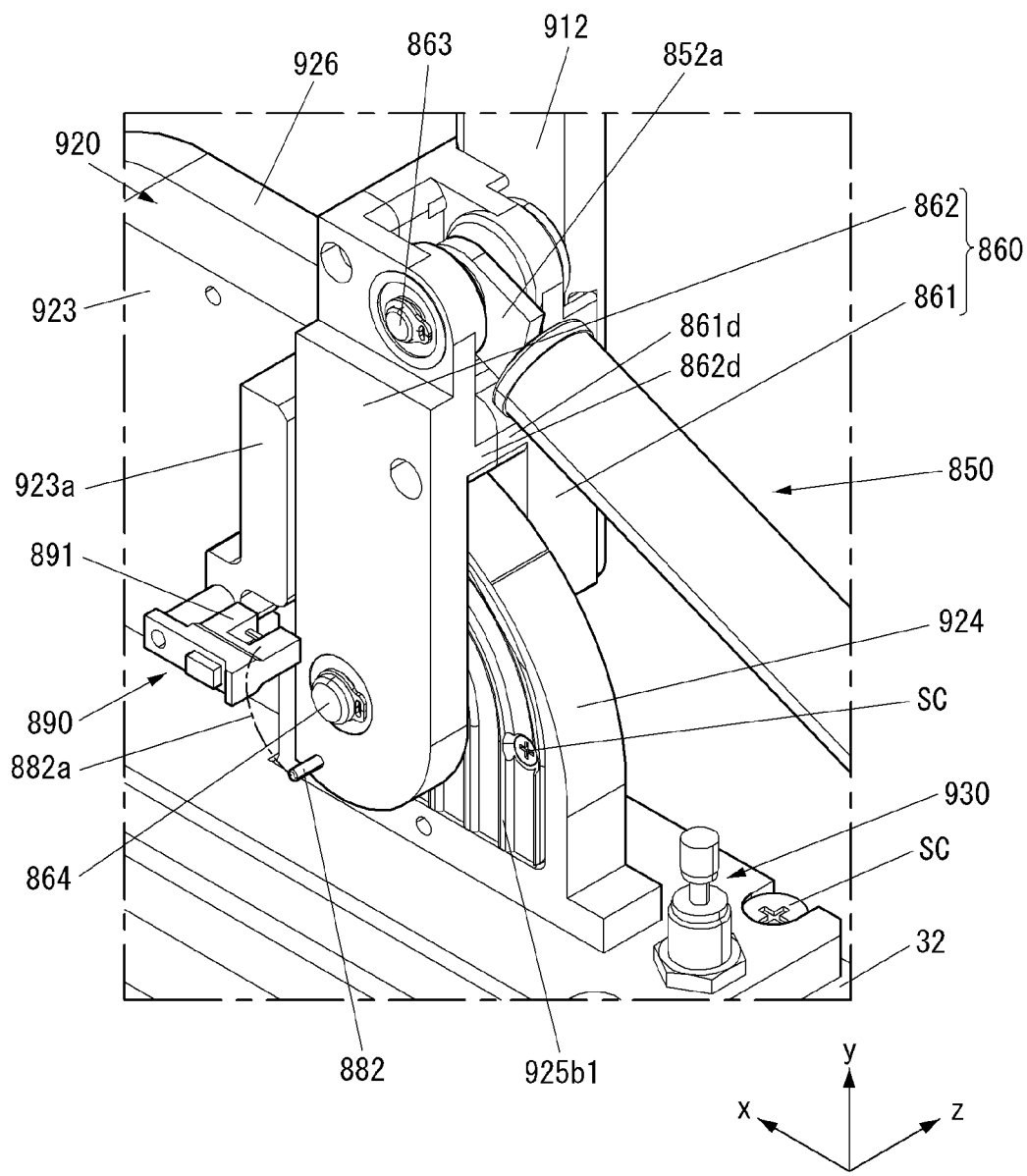

Referring to FIG. 33, a sensor 890 may be disposed on rear surfaces of mounts 920 and 920L. A sensor mount 923 may be formed on the rear surface of the gear mount 920. The sensor mount 923 and the gear mounts 920 and 920L may be integrally formed. The sensor 890 may be disposed on the sensor mount 923. The sensor 890 may be provided in plural. The sensor 890 may include a position sensing unit 891. The sensor 890 may be referred to as a position sensor 890 or an angle sensor 890. A protrusion 882 may be formed on the rear surface of the second part 862 of the link 860. The protrusion 882 may be provided in plural. The protrusion 882 may be referred to as a block 882. As the link 860 rotates or pivots, the protrusion 882 may pass through the position sensing portion 891. As the link 860 rotates or pivots, the sensor 890 may sense the protrusion 882 passing through the position sensing unit 891. The sensor 890 may sense an amount of rotation, a rotation direction, or a rotation speed of the link 860 through the position sensing unit 891. As the link 860 pivots or rotates, the protrusion 882 may form a circular moving line 882a. The moving line 882a may be referred to as a locus 882a, a trace 882a, a pivot trace 882a, a pivot moving line 882a, a rotation trace 882a, or a rotational moving line 882a.

Figure 34:
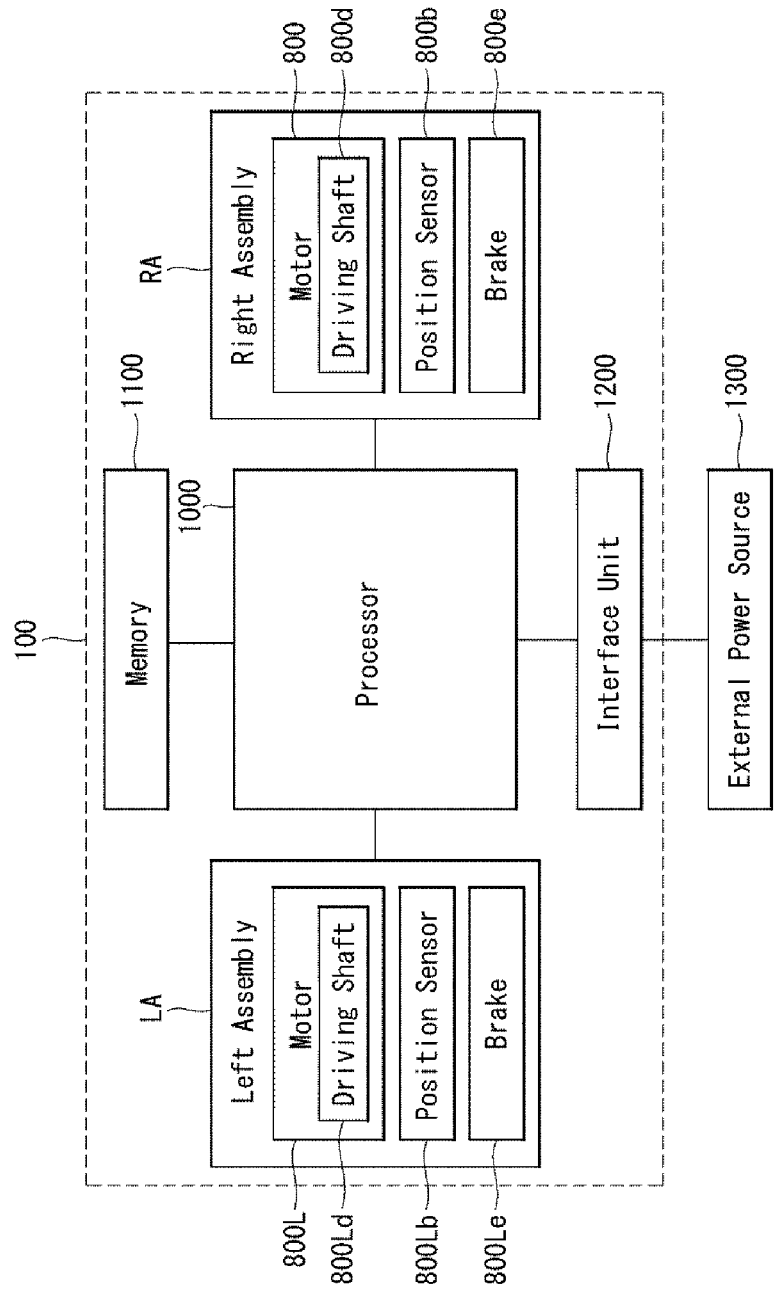

Referring to FIG. 34, the display device 100 may include an interface unit 1200 connected to an external device. The interface unit 1200 may be connected to an external power source 1300 and may receive power from the external power source 1300. A processor 1000 may distribute power to respective components. The processor 1000 may be referred to as a control unit 1000 or a controller 1000.

A memory 1100 may store various data for an operation of the display device 100, such as a program for processing or controlling the processor 1000. The memory 1100 may store multiple application programs or applications that are executed by the display device 100.

The processor 1000 may control the operation of the left assembly LA and the right assembly RA. The drive of the left assembly LA and the drive of the right assembly RA have to be symmetrical, so that the display unit 20 can be smoothly rolled on or unrolled from the roller 143.

The processor 1000 can control the motors 800 and 800L at the same time. The processor 1000 can control an amount of rotation, a rotation speed, or a rotation direction of the drive shafts 800d and 800Ld of the motors 800 and 800L. The processor 1000 can control the rotation directions of the drive shafts 800d and 800Ld of the motors 800 and 800L to be opposite to each other. The processor 1000 can control the rotation speeds of the drive shafts 800d and 800Ld of the motors 800 and 800L to be equal to each other. The processor 1000 can control the rotation amounts of the drive shafts 800d and 800Ld of the motors 800 and 800L to be equal to each other. As the rotation amounts or the rotation speeds of the drive shafts 800d and 800Ld of the motors 800 and 800L are controlled to be equal to each other, rotation amounts or pivot amounts of the links 911 and 911L may be equal to each other. As the rotation amounts or the rotation speeds of the drive shafts 800d and 800Ld of the motors 800 and 800L are controlled to be equal to each other, movements of the links 911 and 911L can be symmetrical. As the rotation amounts or the rotation speeds of the drive shafts 800d and 800Ld of the motors 800 and 800L are controlled to be equal to each other, the top case 950 can maintain horizontal and move up and down in the y-axis direction.

The processor 1000 may sense an amount of rotation, a rotation speed, or a rotation direction of the motor 800L of the left assembly LA through a position sensor 800Lb. The position sensor 800Lb may include at least one of a PCB 870 or a sensor 890. The amount of rotation may mean an angular displacement. The rotation speed may mean an angular velocity. The processor 1000 may sense an amount of rotation, a rotation speed, or a rotation direction of the motor 800 of the right assembly RA through a position sensor 800b. The position sensor 800b may include at least one of a PCB 870 or a sensor 890. The motors 800 and 800L may include brakes 800e and 800Le for braking the drive shafts 800d and 800Ld. The processor 1000 can control the operation of the brakes 800e and 800Le to slow the rotation speeds of the motors 800 and 800L or to stop the driving of the motors 800 and 800L.

When an amount of rotation of one of the motors 800 and 800L is more than the other motor, the processor 1000 may slow a rotation speed of the motor with the more amount of rotation or stop the driving of the motor with the more amount of rotation. Alternatively, when an amount of rotation of one of the motors 800 and 800L is more than the other motor, the processor 1000 may increase a rotation speed of the motor with the less amount of rotation.

When a magnitude of a rotation speed of one of the motors 800 and 800L is larger than the other motor, the processor 1000 may slow the rotation speed of the motor with the larger magnitude of the rotation speed or stop the driving of the motor with the larger magnitude of the rotation speed. Alternatively, when a magnitude of a rotation speed of one of the motors 800 and 800L is larger than the other motor, the processor 1000 may increase the rotation speed of the motor with the less magnitude of the rotation speed.

Figure 35:
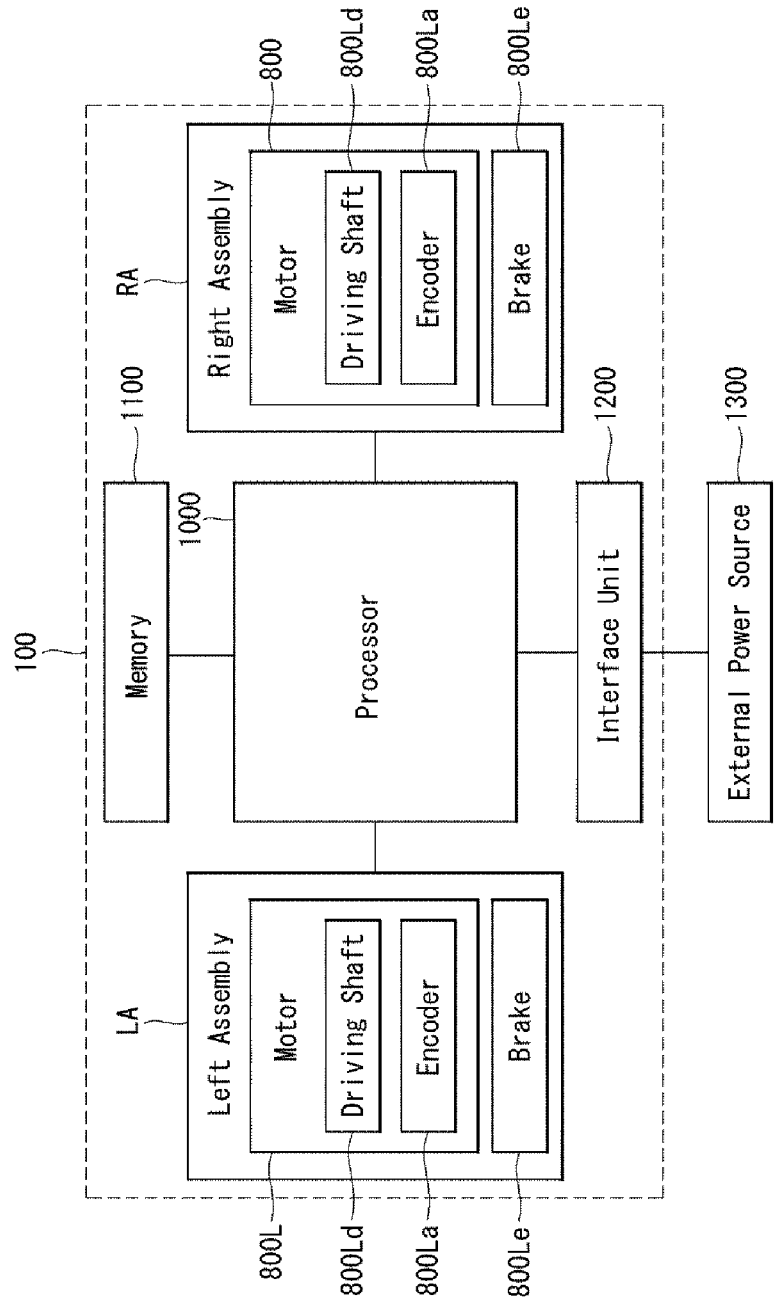

Referring to FIG. 35, the motors 800 and 800L may include encoders 800La and 800a sensing an amount of rotation, a rotation speed, or a rotation direction of the drive shafts 800d and 800Ld. The processor 1000 may receive information about the rotation amount, the rotation speed, or the rotation direction of the drive shafts 800d and 800Ld of the motors 800 and 800L through the encoders 800La and 800a. The motors 800 and 800L may include brakes 800e and 800Le for braking the rotation of the drive shafts 800d and 800Ld. The processor 1000 can control the operation of the brakes 800e and 800Le to slow the rotation speeds of the motors 800 and 800L or to stop the driving of the motors 800 and 800L.

When an amount of rotation of one of the motors 800 and 800L is more than the other motor, the processor 1000 may slow a rotation speed of the motor with the more amount of rotation or stop the driving of the motor with the more amount of rotation. Alternatively, when an amount of rotation of one of the motors 800 and 800L is more than the other motor, the processor 1000 may increase a rotation speed of the motor with the less amount of rotation.

When a magnitude of a rotation speed of one of the motors 800 and 800L is larger than the other motor, the processor 1000 may slow the rotation speed of the motor with the larger magnitude of the rotation speed or stop the driving of the motor with the larger magnitude of the rotation speed. Alternatively, when a magnitude of a rotation speed of one of the motors 800 and 800L is larger than the other motor, the processor 1000 may increase the rotation speed of the motor with the less magnitude of the rotation speed.

Figure 36:
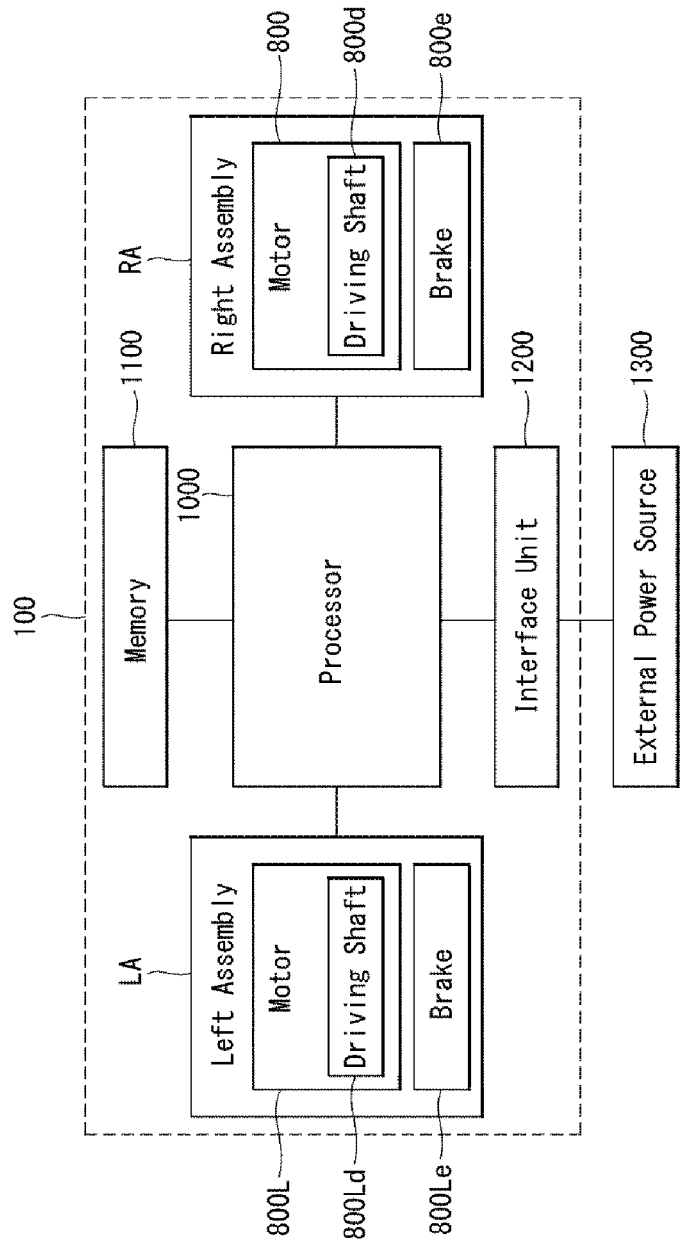

Referring to FIG. 36, the motors 800La and 800a may be a step motor, a stepper motor, or a stepping motor. The processor 1000 can control the motors 800 and 800L at the same time. The processor 1000 can control an amount of rotation, a rotation speed, or a rotation direction of the drive shafts 800d and 800Ld of the motors 800 and 800L. The amount of rotation of the drive shafts 800d and 800Ld of the motors 800 and 800L may mean the number of steps that the drive shafts 800d and 800Ld have rotated. The rotation speed of the drive shafts 800d and 800Ld of the motors 800 and 800L may mean the number of steps that the drive shafts 800d and 800Ld have rotated per unit time. The motors 800 and 800L may include brakes 800e and 800Le for braking the rotation of the drive shafts 800d and 800Ld. The processor 1000 can control the operation of the brakes 800e and 800Le to slow the rotation speeds of the motors 800 and 800L or to stop the driving of the motors 800 and 800L. The processor 1000 may receive information about the rotation amount, the rotation speed, or the rotation direction of the drive shafts 800d and 800Ld of the motors 800 and 800L from the motors 800 and 800L.

When an amount of rotation of one of the motors 800 and 800L is more than the other motor, the processor 1000 may slow a rotation speed of the motor with the more amount of rotation or stop the driving of the motor with the more amount of rotation. Alternatively, when an amount of rotation of one of the motors 800 and 800L is more than the other motor, the processor 1000 may increase a rotation speed of the motor with the less amount of rotation.

When a magnitude of a rotation speed of one of the motors 800 and 800L is larger than the other motor, the processor 1000 may slow the rotation speed of the motor with the larger magnitude of the rotation speed or stop the driving of the motor with the larger magnitude of the rotation speed. Alternatively, when a magnitude of a rotation speed of one of the motors 800 and 800L is larger than the other motor, the processor 1000 may increase the rotation speed of the motor with the less magnitude of the rotation speed.

Certain embodiments or other embodiments of the disclosure described above are not mutually exclusive or distinct from each other. Any or all elements of the embodiments of the disclosure described above may be combined or combined with each other in configuration or function For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a housing;
a roller installed inside the housing;
a display unit rolled or unrolled around the roller;
a first foldable link and a second foldable link opposite to each other, the first foldable link and the second foldable link each including one end pivotally coupled to the housing and another end pivotally coupled to an upper part of the display unit;
a first motor and a second motor installed inside the housing and respectively pivoting the first foldable link and the second foldable link; and
a controller configured to obtain motion information from the first motor and the second motor and control the first motor and the second motor based on the obtained motion information such that the first foldable link and the second foldable link are synchronized.

2. The display device of claim 1, further comprising a gas spring installed inside the housing,
wherein the gas spring includes:
a cylinder pivotally coupled to the housing; and
a piston reciprocating inside of the cylinder and pivotally coupled to the first foldable link.

3. The display device of claim 1, wherein the first foldable link includes:
a lower link including one side pivotally coupled to the housing;
an upper link pivotally coupled to the upper part of the display unit, and
a shock absorber that is disposed inside the housing and is in contact with the lower link as the first foldable link is folded.

4. The display device of claim 1, wherein the first motor includes a first rotary encoder sensing an angular displacement of a drive shaft of the first motor,
wherein the controller obtains information about the angular displacement of the drive shaft from the first rotary encoder and controls the first motor.

5. The display device of claim 1, further comprising:
a first gear configured to be rotated by the first motor;
a first protrusion formed on the first gear and spaced apart from an axis of rotation of the first gear; and
a second rotary encoder including a board facing the first gear and a position sensing unit formed on the board and protruding toward the first gear,
wherein the position sensing unit senses the first protrusion as the first gear rotates,
wherein the controller obtains information about an angular displacement of the first gear from the position sensing unit and controls the first motor.

6. The display device of claim 5, wherein the position sensing unit is one of a plurality of position sensing units,
wherein the plurality of position sensing units is arranged along a rotational moving line of the first protrusion.

7. The display device of claim 1, wherein the first foldable link includes:
a lower link including one side pivotally coupled to the housing;
an upper link pivotally coupled to the upper part of the display unit;
a second protrusion formed on the lower link and spaced apart from an axis of pivot of the lower link; and
a position sensor installed inside the housing adjacent to a pivot moving line of the second protrusion, and configured to sense the second protrusion,
wherein the controller obtains information about an angular displacement of the lower link from the position sensor and controls the first motor.

8. The display device of claim 1, wherein the first motor is a step motor,
wherein the controller controls a step of the first motor.

9. The display device of claim 1, further comprising a brake installed on a drive shaft of the first motor,
wherein the controller actuates the brake and controls the first motor.

10. The display device of claim 1, wherein the first foldable link includes:
a lower link including one side pivotally coupled to the housing;
an upper link pivotally coupled to the upper part of the display unit;
a first gear fixed to a drive shaft of the first motor; and
a second gear fixed to the lower link and engaged with the first gear, wherein an axis of rotation of the second gear is aligned with an axis of pivot of the lower link.

11. The display device of claim 10, further comprising:
a third gear coupled to a drive shaft of the first motor;
a first double gear including a primary gear engaged with the third gear and a secondary gear with a larger diameter than the primary gear; and
a second double gear including a third gear engaged with the secondary gear and a fourth gear with a smaller diameter than the third gear and engaged with the second gear.

12. The display device of claim 2, wherein the first foldable link includes:
a lower link including one side pivotally coupled to the housing; and an upper link pivotally coupled to the upper part of the display unit, wherein the gas spring provides, to the lower link, a force for raising the lower link.

13. The display device of claim 2, wherein as the first foldable link is unfolded, a distance between one side and another side of the gas spring increases.

14. The display device of claim 1, wherein the first foldable link includes:

a lower link comprising one side pivotally coupled to the housing;

an upper link pivotally coupled to the upper part of the display unit;

a lower gear formed at an upper end of the lower link; and an upper gear formed at a lower end of the upper link and engaged with the lower gear.

15. The display device of claim 1, wherein the first foldable link further comprises:

a first lower link including one side pivotally coupled to the housing;

a first upper link pivotally coupled to the upper part of the display unit, and a first joint coupling the first lower link and the first upper link, wherein the second foldable link includes:

a second lower link including one side pivotally coupled to the housing;

a second upper link pivotally coupled to the upper part of the display unit, and a second joint coupling the second lower link and the second upper link, wherein as the first lower link and the second lower link are raised, a distance between the first joint and the second joint increases.

* * * * *